(12) United States Patent
Amako et al.

(10) Patent No.: US 7,867,692 B2
(45) Date of Patent: Jan. 11, 2011

(54) METHOD FOR MANUFACTURING A MICROSTRUCTURE, EXPOSURE DEVICE, AND ELECTRONIC APPARATUS

(75) Inventors: Jun Amako, Matsumoto (JP); Atsushi Takakuwa, Shiojiri (JP); Daisuke Sawaki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 1101 days.

(21) Appl. No.: 11/153,553

(22) Filed: Jun. 16, 2005

(65) Prior Publication Data

US 2006/0046156 A1 Mar. 2, 2006

(30) Foreign Application Priority Data

| Aug. 25, 2004 | (JP) | ............................. 2004-245161 |
| Aug. 25, 2004 | (JP) | ............................. 2004-245169 |
| Aug. 25, 2004 | (JP) | ............................. 2004-245177 |
| Jan. 18, 2005 | (JP) | ............................. 2005-010420 |

(51) Int. Cl.
*G03F 7/26* (2006.01)
(52) U.S. Cl. ....................................... 430/313; 430/22
(58) Field of Classification Search ................. 430/313, 430/394, 320, 323, 273.1, 271.1, 1, 945, 430/22

See application file for complete search history.

(56) References Cited

U.S. PATENT DOCUMENTS

| 4,996,120 A * | 2/1991 | Smothers et al. ................ 430/2 |
| 5,415,835 A * | 5/1995 | Brueck et al. ................ 430/311 |
| 5,759,744 A | 6/1998 | Brueck et al. |
| 5,885,753 A * | 3/1999 | Crooks et al. ................ 430/325 |
| 6,074,800 A * | 6/2000 | Breyta et al. ............. 430/270.1 |
| 6,122,103 A | 9/2000 | Perkins et al. |
| 6,218,292 B1 * | 4/2001 | Foote .......................... 438/636 |
| 6,243,199 B1 | 6/2001 | Hansen et al. |
| 6,243,348 B1 | 6/2001 | Goodberlet |
| 6,548,820 B1 | 4/2003 | Mermelstein |
| 6,882,477 B1 * | 4/2005 | Schattenburg et al. ........ 359/577 |
| 2002/0105628 A1 | 8/2002 | Saito et al. |
| 2006/0109532 A1 * | 5/2006 | Savas et al. .................... 359/10 |

FOREIGN PATENT DOCUMENTS

| EP | 0 939 343 A1 | 9/1999 |
| JP | A 58-154285 | 9/1983 |
| JP | A-06-053122 | 2/1994 |

(Continued)

OTHER PUBLICATIONS

Deguchi et al., "Nanofabrication Techniques Using X-Rays," Japan Society of Applied Physics, vol. 73, No. 4, pp. 455-461, 2004 with partial translation.

*Primary Examiner*—Kathleen Duda
*Assistant Examiner*—Caleen O Sullivan
(74) *Attorney, Agent, or Firm*—Oliff & Berridge, PLC

(57) ABSTRACT

Aspects of the invention can provide a method for manufacturing a microstructure, including forming a photosensitive film above a work piece, exposing the photosensitive film, as a first exposure, by irradiating interference light generated by intersecting two laser beams having a wavelength shorter than a wavelength of visible light, developing the exposed photosensitive film so as to develop a shape corresponding to a pattern of the interference light to the photosensitive film, and etching the work piece using the developed photosensitive film as an etching mask.

5 Claims, 21 Drawing Sheets

FOREIGN PATENT DOCUMENTS

| | | |
|---|---|---|
| JP | A-06-300909 | 10/1994 |
| JP | A-07-159609 | 6/1995 |
| JP | A-07-263321 | 10/1995 |
| JP | A 11-26344 | 1/1999 |
| JP | A-11-345758 | 12/1999 |
| JP | 2001-033982 * | 9/2001 |
| KR | B1-10-0400893 | 12/1995 |
| TW | 445512 | 7/2001 |
| WO | WO 01/35168 A1 | 5/2001 |

* cited by examiner

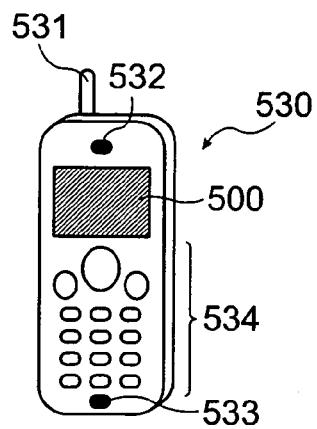
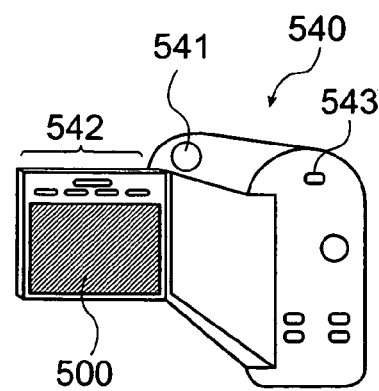
FIG. 28A    FIG. 28B
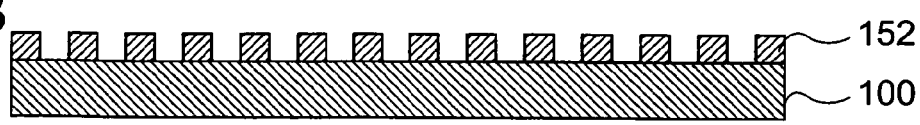

US 7,867,692 B2

METHOD FOR MANUFACTURING A MICROSTRUCTURE, EXPOSURE DEVICE, AND ELECTRONIC APPARATUS

This application claims the benefit of Japanese Patent Application No. 2004-245161, filed Aug. 25, 2004, Japanese Patent Application No. 2004-245169, filed Aug. 25, 2004, Japanese Patent Application No. 2004-245177, filed Aug. 25, 2004 and Japanese Patent Application No. 2005-10420, filed Jan. 18, 2005. The entire disclosure of the prior applications are hereby incorporated by reference herein in their entirety.

BACKGROUND

Aspects of the invention can relate to a method for realizing a fine concavo-convex pattern in the order of wavelength shorter than a wavelength of visible light on a substrate such as glass, etc., and a device thereof.

Microminiaturization is highly demanded in a variety of devices, such as optical elements of polarization elements, antireflection elements, etc., or semiconductor elements of transistors, etc. Engineering developments are promoted in order to realize fine processing in the order of wavelength shorter than a wavelength of visible light (e.g., 100 nm or below). For example, methods for exposing by steppers or electron beam lithography are known as a method for making fine patterns in the order of subwavelength. Lithograph techniques have been proposed that utilizes an x-ray having a smaller wavelength than ultraviolet rays. An example of related art is described in Applied Physics, the Japan Society of Applied Physics, Vol. 73, No. 4, 455-461, 2004.

The above-mentioned related art technique has a disadvantage in that both process margin and throughput are low while fine processing can be achieved, so that the related art technique is not suitable for mass production. In order to avoid the disadvantage, huge production costs are needed for manufacturing equipment.

SUMMARY

An advantage of the invention can be to provide a technique that can realize a fine processing in the order of wavelength shorter than a wavelength of visible light with low costs.

A method for manufacturing a microstructure according to a first aspect of the invention can include a step of forming a photosensitive film above a work piece, a step of exposing the photosensitive film, as a first exposure, by irradiating interference light generated by intersecting two laser beams having a wavelength shorter than a wavelength of visible light, a step of developing the exposed photosensitive film so as to develop a shape corresponding to a pattern of the interference light to the photosensitive film, and a step of etching the work piece using the developed photosensitive film as an etching mask.

Wavelength shorter than that of visible light means a wavelength that is approximately 300 nm and below. Also, work piece corresponds to anything that can be processed by etching. For example, a thin film made of a variety of materials (metals, glasses, resins, etc.), or a substrate (base body), etc., can correspond to the work piece.

By intersecting two laser beams at a certain degree of angle, interference light (interference fringes) is obtained that has a contrasting (light intensive distribution) having a pitch of the same level or smaller than of the wavelength of the laser beam. More specifically, the pitch of the interference light, theoretically, can be achieved at approximately half of the wavelength of each laser beam. Utilizing such interference light for an exposure allows manufacturing devices to be drastically simplified. Therefore, fine processing in the order of wavelength shorter than a wavelength of visible light can be realized with low costs.

In the step of the first exposure, it is preferable that the exposure is performed in which a light intensity distribution of the interference light is set to be changeable by adjusting an intensity ratio between the two laser beams.

In the exposure, the light intensity distribution of the interference light is set to be changeable so that the contrast of the interference light (interference fringes) is set to be changeable, whereby a variety of latent image patterns can be achieved each of which has a different shape and an aspect ratio. Consequently, the number of variations in shape and aspect ratio of the microstructure can be increased that is obtained by developing and transferring the latent image pattern.

In the step of the first exposure, it is preferable that the photosensitive film is exposed a plurality of times for each of which a relative arrangement between the interference light and the photosensitive film is changed to be set. Accordingly, a microstructure can be achieved that is composed of a fine two-dimensional pattern.

In the step of the first exposure, it is preferable that the photosensitive film is exposed a plurality of times for each of which an intensity ratio between the two laser beams is set as a different value. Accordingly, a variety of latent image patterns can be realized in which shapes and aspect ratios are different each other by setting the contrast of the interference light to be changeable in each exposure. As a result, the number of variations of microstructures obtained by transferring the pattern can be increased. Even in a case where a plurality of times of exposure is performed by changing the intensity ratio between laser beams without changing the relative position of the interference light and the photosensitive film, a variety of latent image patterns can be achieved by irradiating some interference light each of which has a different contrast from each other so as to be overlapped.

For the photosensitive film, a variety of types, such as a conventional photo resist (photosensitive resin), etc., can be employed, particularly, it is preferable that a chemical amplification resist is used. As a result, a highly precise exposed pattern can be achieved that accurately corresponds to the pitch of the interference fringes.

In a case where a chemical amplification resist is employed as the photosensitive film, it is preferable that a concentration of alkali impurities is one part per billion (ppb) and below in an atmosphere in which the step of forming the photosensitive film, the step of exposing, and the step of developing are performed. Here, alkali impurities can mean impurities affect the characteristics of the chemical amplification resist, corresponding to mainly ammonia. By controlling the alkali impurities low concentration, an exposed pattern can be achieved in which the contrast pattern of the interference fringes is highly precisely reflected.

It is preferable that a self-assembled monolayer film is used as the photosensitive film. The self-assembled monolayer film can have an advantage in that less material consumption due to its ultra thin film, and various functions can be demonstrated, enabling variations of formed microstructures to be increased.

It is preferable that a step of exposing the photosensitive film by irradiating interference light as a second exposure is further included. The second exposure is performed between after the step of the first exposure and before the step of developing, and the interference light is generated by intersecting the two laser beams while a phase difference different from a phase difference in the step of the first exposure is applied between the two laser beams.

A finer latent image pattern can be formed by performing the multiple-exposure in which the phase difference between the two laser beams is set to be changeable, while the interference light is displaced by a predetermined amount (e.g., by half of a period).

In the step of the second exposure, it is preferable that a phase modulation unit that applies a phase modulation to at least one of the two laser beams so that the phase difference occurs. Here, phase difference plates (½ wavelength plate, etc.) and liquid crystal elements, etc., are exemplified as the unit. As a result, the phase difference between the two laser beams can easily be controlled. Particularly, it is preferable that liquid crystal elements, etc., are used. In this case, the phase difference between the two laser beams can be continuously controlled by changing alignment conditions of the liquid crystal elements in response to an applied voltage.

For the photosensitive film, it is preferable that one that demonstrates a multiphoton absorption is used. Using such photosensitive film having nonlinear reaction characteristics, a latent image occurs only a part at which irradiated light intensity is a certain level or above (e.g., approximately the maximum value). As a result, a sharpened latent pattern is achieved that accurately corresponds to the pitch of the interference fringes.

It is preferable that, prior to the step of forming the photosensitive film, a step of forming an antireflection film is further included that lies between the work piece and the photosensitive film. Here, for the antireflection film, both inorganic materials and organic materials (e.g., DUV 44, available from Nissan Chemical Industries, Ltd.,) can be employed that can suppress the reflection of the interference light by absorbing the interference light, etc. Particularly, an organic material makes separations (removals) in later process easier. As a result, an unwanted part of the photosensitive film can be prevented or reduced from being exposed by a rear reflection of the interference light, thereby enabling a good exposed pattern to be obtained.

It is preferable that, after the step of forming the photosensitive film, a step of forming a protective film on a surface of the photosensitive film is further included. Here, for the protective film, anything such as inorganic materials, organic materials, etc., can be employed that as long as functions as a desired function. This can permit the photosensitive film to be isolated from air so that influences from surroundings can be suppressed. Particularly, it is preferable that in a case where a chemical amplification resist, etc., which is easily influenced by surroundings, is used as the photosensitive film.

It is preferable that one and the other of the two laser beams are reached an exposure surface of the photosensitive film symmetrically to an axis normal to the exposure surface. This allows the exposed depth, and the width of a region to be exposed, and a pitch of exposed pattern (latent image), etc., to be more evenly provided. Accordingly, line patterns can easily be obtained that are arranged at an equal interval. It is preferable that each of the two laser beams is linearly polarized, whose polarization direction is perpendicular to a plane defined by the two laser beams. As a result, more sharpened interference fringes can be achieved regardless of an intersection angle between the two laser beams.

It is preferable that the two laser beams are generated by a branching unit that divides one laser beam that is output from one laser light source. Here, optical elements such as amplitude-dividing beam splitters, polarization-dividing beam splitters, diffractive beam splitters, etc., are exemplified as the branching unit. As a result, the two laser beams related to the exposure can be achieved by a simple construction, thereby enabling production costs to be further reduced.

It is more preferable that the branching unit generates plus/minus n-order diffracted beams, the plus/minus n-order diffracted beams being used as the two laser beams, where n is natural number of one and more. By utilizing the diffractive beams, the two laser beams are easily obtained that are preferable to the first aspect of the invention. The beams have nearly equal energy, and whose traveling directions are symmetrical to each other.

It is more preferable that the branching unit further generates zero-order beam whose energy is lower than energy of the plus/minus n-order diffracted beams, a relative position between the photosensitive film and the interference light being set with reference to the zero-order beam. By utilizing the zero-order beam, the relative position between the photosensitive film and the interference light can be easily set.

The branching unit may generate one transmitting beam and the other diffracted beam traveling a direction different from the traveling direction of the transmitting beam. In this case, the transmitting beam and the diffracted beam are used as the two beams. By utilizing the transmitting beam and the diffractive beam, the two beams are easily obtained that are preferable to the first aspect of the invention.

A method for manufacturing a microstructure according to a second aspect of the invention can include a step of exposing a work piece having photosensitivity, as a first exposure, by irradiating interference light that is generated by intersecting two laser beams having a wavelength shorter than a wavelength of visible light, and a step of developing an exposed part of the work piece so as to develop a concavo-convex shape corresponding to a pattern of the interference light to the photosensitive film.

Here, the work piece having photosensitivity includes anything that has photoreactive property by which an exposure can be performed by irradiating interference light, and can be removed by developing the irradiated part (or parts excluding the irradiated part). For example, films or substrates (base bodies), etc., that are made of resins, such as polyimide or acrylic, etc., that have photosensitivity can be included.

According to the method, the work piece can be directly exposed by the interference light obtained by intersecting the two laser beams, thereby enabling manufacturing devices to be drastically simplified. Therefore, fine processing in the order of wavelength shorter than a wavelength of visible light can be realized It is preferable that a step of exposing the photosensitive film by irradiating interference light as a second exposure is further included. The second exposure is performed between after the step of the first exposure and before the step of developing. The interference light is generated by intersecting the two laser beams while a phase difference different from a phase difference in the step of the first exposure is applied between the two laser beams.

A finer latent image pattern can be formed by performing the multiple-exposure in which the phase difference between two laser beams is set to be changeable, while the interference light is displaced by a predetermined amount (e.g., by half of a period).

In the step of the first exposure, it is preferable that the exposure is performed in which a light intensity distribution of the interference light is set to be changeable by adjusting an intensity ratio between the two laser beams.

In the exposure, the light intensity distribution of the interference light is set to be changeable so that the contrast of the interference light (interference fringes) is set to be changeable, whereby a variety of latent image patterns can be achieved each of which has a different shape and an aspect ratio each other. Consequently, the number of variations in shape and aspect ratio of the microstructure can be increased that is obtained by developing and transferring the latent image pattern.

The first aspect of the invention (e.g., the method for generating the two laser beams, etc.) can be arbitrary applied to the second aspect of the invention more advantageously.

An exposure device that exposes a photosensitive film or a work piece having photosensitivity according to a third aspect of the invention includes a beam generation unit that generates two laser beams having a wavelength shorter than a wavelength of visible light, and an optical unit that sets a path of each of the two laser beams so that interference light is generated by intersecting the two laser beams at a predetermined angle, the photosensitive film or the work piece being exposed using the interference light.

In the exposure device, by intersecting the two laser beams at a certain degree of angle, interference light is generated that has a contrasting having a pitch of the same level or smaller than of the wavelength of the laser beams. As a result, exposure devices (manufacturing devices) can be drastically simplified that are necessary for fine processing. Therefore, fine processing in the order of wavelength shorter than a wavelength of visible light can be realized Preferably, a phase modulation unit can be further included that applies a phase modulation to at least one of the two laser beams, the unit being disposed in a path of the one. The photosensitive film or the work piece is exposed a plurality of times for each of which a different phase difference is applied between the two laser beams by the unit.

A finer latent image pattern can be formed by performing the multiple-exposure in which the phase difference between the two laser beams is set to be changeable, while the interference light is displaced by a predetermined amount (e.g., by half of a period). As a result, exposure devices (manufacturing devices) can be drastically simplified that are necessary for fine processing.

It is preferable that the photosensitive film or the work piece in this case demonstrates a multiphoton absorption. As a result, a sharpened latent pattern is achieved that accurately corresponds to the pitch of the interference fringes.

It is preferable that the phase modulation unit in this case is a phase difference plate or a liquid crystal spatial light modulation element. As a result, the phase difference between the two laser beams can easily be controlled. Particularly, in the case where the phase difference plate is employed, the phase modulation unit according to the third aspect of the invention can be realized with lower costs. Also, it is preferable that liquid crystal spatial light modulation elements are used. In this case, the phase difference between the two laser beams can be continuously controlled by changing alignment conditions of the liquid crystal elements in response to an applied voltage.

It is preferable that a beam intensity ratio control unit is further included that adjusts an intensity ratio between the two laser beams by increasing or decreasing the intensity of at least one of the two laser beams, the unit being disposed in a path of the one. A light intensity distribution of the interference light is preferably set to be changeable by adjusting the intensity ratio between the two laser beams. The photosensitive film or the work piece is preferably exposed using the interference light.

In the exposure, the light intensity distribution of the interference light can be set to be changeable so that the contrast of the interference light (interference fringes) is set to be changeable, whereby a variety of latent image patterns can be achieved each of which has a different shape and an aspect ratio each other. Consequently, the number of variations in shape and aspect ratio of the microstructure obtained by transferring the latent image pattern can be increased.

It is preferable that the unit in this case is a diffractive beam splitter. As a result, a construction of exposure devices can be simplified.

Preferably, a position-setting unit is further included that sets a relative position between an occurrence position of the interference light and the photosensitive film or the work piece. As a result, radiating condition of the interference light to the photosensitive film, etc., is freely changed, thereby enabling a variety of exposed patterns to be obtained.

Preferably, the beam generation unit includes a laser light source that outputs one laser beam, and a branching unit that generates two laser beams by dividing the one laser beam. As a result, a construction of exposure devices can be more simplified as compared with another alternatives (e.g., two laser light sources are synchronously used, etc.).

It is more preferably that the branching unit is a diffractive beam splitter. Plus/minus n-order diffracted beams obtained by the diffractive beam splitter are preferably used as the two laser beams, where n is natural number of one and more. As a result, the two laser beams are easily obtained that are preferable to the third aspect of the invention.

It is more preferable that the diffractive beam splitter generates a zero-order beam whose energy is lower than that of the plus/minus n-order diffracted beams in addition to the plus/minus n-order diffracted beams. With reference to the zero-order beam, a relative position between the interference light and the photosensitive film or the work piece can be easily set.

More preferably, a monitor is further included that receives the zero-order beam to convert it to an electrical signal. By converting the intensity of the zero-order beam to the electrical signal, position, etc., of the zero-order beam can easily be referred.

It is preferable that the branching unit is a diffractive element. One transmitting beam and the other diffracted beam traveling to a direction different from the traveling direction of the transmitting beam that are obtained by the diffractive element are preferably used as the two laser beams. As a result, the two laser beams are also easily obtained that are preferable to the third aspect of the invention.

It is preferable that beam expanders are further included each of which is disposed in a path of each of the two laser beams so as to expand a beam diameter of each of the two laser beams. As a result, a wide exposed area can be secured.

An electronic apparatus according to a fourth aspect of the invention can include the microstructure manufactured by the method according to the first aspect or the second aspect of the invention, or using the exposure device according to the third aspect of the invention.

Here, optical elements (optical thin film devices) having functions, such as polarization light separation, phase delay, antireflection, birefringence reduction, etc., are exemplified as the microstructure. Typically, liquid crystal projectors including liquid crystal devices in which the optical element can be used as the polarization element are exemplified as electronic apparatuses including such optical element.

BRIEF DESCRIPTION OF THE DRAWINGS

The invention will be described with reference to the accompanying drawings, wherein like numbers refer to like elements, and wherein:

FIGS. 21A-20C are process sectional views illustrating a case in which a substrate having photosensitivity serves as a work piece;

FIGS. 28A and 28B are explanatory diagrams illustrating specific examples of electronic apparatuses;

FIGS. 29A and 29B are process sectional views illustrating a case in which a film having photosensitivity serves as a work piece.

DETAILED DESCRIPTION OF PREFERRED EMBODIMENTS

Exemplary embodiments of the invention will now be described below with reference to the accompanying drawings.

Figure 1:
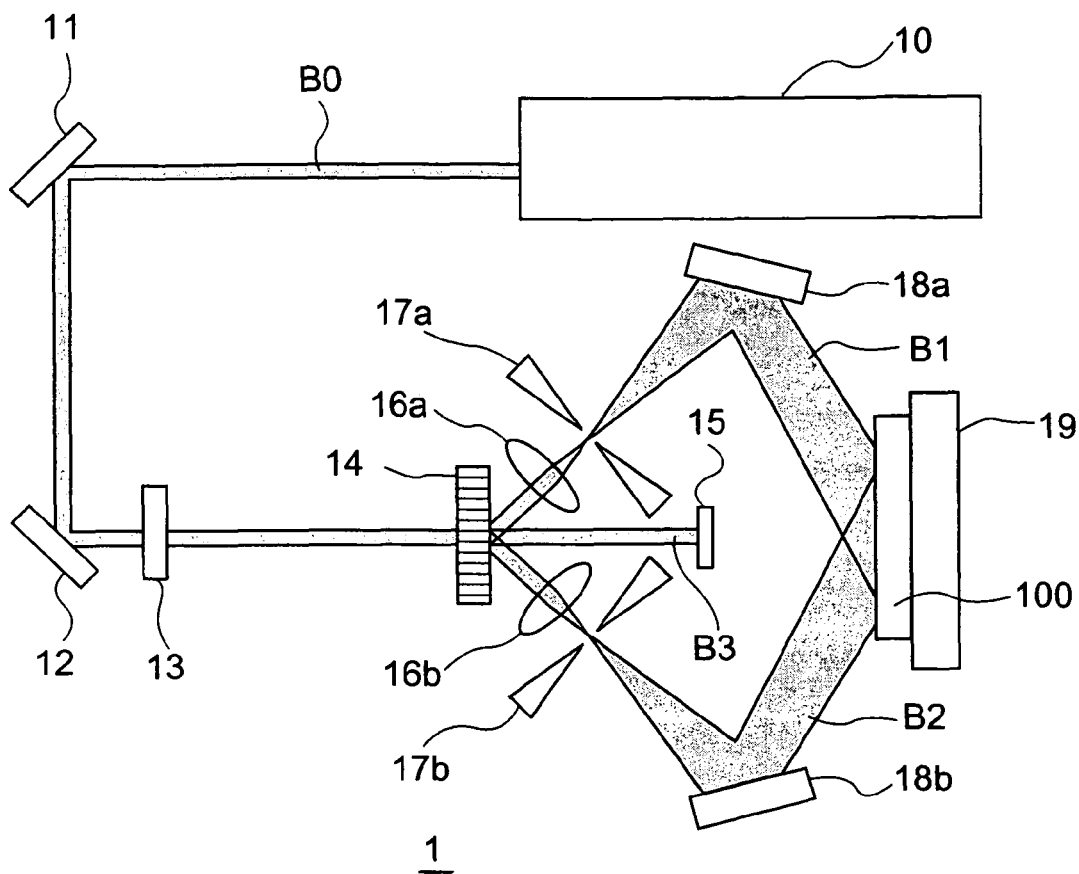
FIG. 1 is an explanatory diagram illustrating a construction of an exposure device according to a first exemplary embodiment of the invention.

FIG. 1 is an explanatory diagram illustrating a construction of an exposure device according to a first exemplary embodiment of the invention. An exposure device 1 shown in FIG. 1 is served for exposing a photosensitive film. The exposure device 1 can include a laser light source 10, mirrors 11 and 12, a shutter 13, a diffractive beam splitter 14, a monitor 15, lenses 16a and 16b, spatial filters 17a and 17b, mirrors 18a and 18b, and a stage 19.

The laser light source 10 outputs one laser beam having a shorter wavelength than a wavelength of visible light. For the laser light source 10, a variety of laser oscillators are preferably used. In the exemplary embodiment, a solid-state ultra violet (UV) laser Nd: $YVO_4$ (the fourth harmonic wave: a wavelength of 260 nm, the maximum output of approximately 200 mw, and CW oscillation) can be used for the laser light source 10 as an example. As shown in the FIG. 1, a laser beam B0 (e.g., a beam diameter of approximately 1 mm) emitted from the laser light source 10 is changed its path (optical path) by each of mirrors 11 and 12, reaching the diffractive beam splitter 14 after passing through the shutter 13.

The shutter 13, which is disposed in the path of the laser beam B0 as mentioned above, functions to pass through or block the laser beam B0.

The diffractive beam splitter 14 is a branching unit that divides the one laser beam B0 into two laser beams B1 and B2. The diffractive beam splitter 14 is a surface-relief type diffractive element that realizes its function using a shape effect due to a fine concavo-convex shape provided on a surface of quartz, etc. The splitter, which is wholly made of quartz, etc., is so highly durable that no damage is given even though high power UV laser is irradiated, enabling it to be used almost permanently. The shape and depth of the diffractive beam splitter 14 is so optimally designed that, if an incident beam is transverse electrical (TE) polarized beam, the diffractive beam splitter 14 generates two diffractive beams (plus/minus first order) having equal strength. In the exemplary embodiment, these plus/minus first order diffraction beams are used for each of the laser beams B1 and B2. In the exemplary embodiment, the diffractive beam splitter 14 is designed so that a zero-order beam remains little energy.

Upon assembling an optical system, with reference to the zero-order beam B3, setting an intersecting angle of each of laser beams B1 and B2 on a substrate 100, and an alignment of the substrate 100 can easily be carried out. In addition, two brunched laser beams B1 and B2 interfere each other, both which have the same intensity distribution. This makes it possible to obtain high contrast interference fringes, thereby having an advantage to form a pattern with a high aspect ratio.

The diffractive beam splitter 14 may generate plus/minus second-order or higher-order diffractive beams so as to use the beams for the laser beams B1 and B2. For the branching unit, an amplitude-dividing beam splitter, which is simple, and a polarization-dividing beam splitter, which is superb in durability, also can be used, instead of the diffractive beam splitter. In a case where the polarization-dividing beam splitter is used, a polarization direction of one of the divided beams is required to be converted to TE using a wave plate.

The monitor 15 (monitoring means) receives the zero-order beam B3 so as to convert the B3 to an electrical signal. The position control of the stage 19 based on an output from the monitor 15 allows the setting of an intersecting angle of each of laser beams B1 and B2 on the substrate 100, and an alignment of the substrate 100 to be performed easily. Here, in FIG. 1, the monitor 15 is disposed closely adjacent to the diffractive beam splitter 14 than the substrate 100 for convenience. However, it should be understood that the position of the monitor 15 is not limited to this, can be designated at any positions. For example, the monitor 15 may be movable so that it is disposed at nearly the same position of the substrate 100 upon an alignment, while it is moved to another position upon an exposure. For simpler monitoring means, the zero-order beam B3 may be referred using a paper medium, etc., generating fluorescence upon radiation of the zero-order beam B3.

The lens 16a, which is disposed so that one of the laser beams generated by the diffractive beam splitter 14 is reached, converges the laser beam B1. The spatial filter 17a, which has a pinhole, is disposed so that the laser beam B1 converged by the lens 16a is reached the pinhole. That is, a beam expander is constructed by the lens 16a and the spatial filter 17a, by which a beam diameter of the laser beam B1 is expanded. Like wise, the lens 16b, which is disposed so that the other of the laser beams generated by the diffractive beam splitter 14, i.e., the laser beam B2, is reached, converges the laser beam B2. The spatial filter 17b, which has a pinhole, is disposed so that the laser beam B2 converged by the lens 16b is reached the pinhole. That is, a beam expander is constructed by the lens 16b and the spatial filter 17b, by which a beam diameter of the laser beam B2 is expanded. For example, in the embodiment, a beam diameter of each of the laser beams B1 and B2 is expanded to approximately 200 mm by each beam expander. With functions of each of the spatial filters 17a and 17b, a beam wavefront after removing unnecessary scattered light can be used for an exposure. This makes it possible to form a clear exposed pattern without any defects and noises. Thus, a clear latent image can be formed.

The mirror 18a, which is disposed so that the laser beam B1 passed through the spatial filter 17a is reached, reflects the laser beam B1 to the substrate 100. Likewise, the mirror 18b, which is disposed so that the laser beam B2 passed through the spatial filter 17b is reached, reflects the laser beam B2 to the substrate 100. These mirrors 18a and 18b function as an optical unit that sets a path of each laser beam so that two laser beams B1 and B2 intersect each other at a predetermined angle to generate interference light.

The stage 19, which supports the substrate 100, relatively sets a position of the substrate 100 so that a photosensitive film on the substrate 100 is exposed by the interference light (interference fringes) generated by the intersection of each of the laser beams B1 and B2. That is, the stage 19 functions as a position-setting unit that sets a relative position between the photosensitive film and the interference light.

Figure 2:
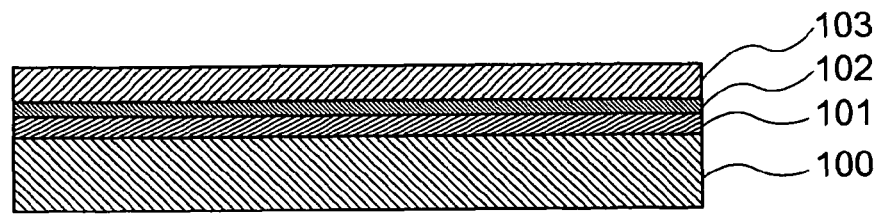
FIG. 2 is a sectional view explaining a photosensitive film, etc., formed on a surface of a substrate.

FIG. 2 is a sectional view explaining a structure of the substrate 100, and a photosensitive film, etc., formed on the surface of the substrate 100. As shown in FIG. 2, a metal thin film 101 that serves as a work piece, an antireflection film 102, and a photosensitive film 103 are formed on one surface of the substrate 100.

The substrate 100 supports the metal thin film 101 that serves as a work piece. For example, in the exemplary embodiment, the metal thin film 101 is processed to lattice-shaped to form a wire grid polarization element. Thus, transparent materials, such as a glass substrate, a resin substrate, etc., are used for the substrate 100.

The metal thin film 101 is a film that is made of metal, such as aluminum, etc. The metal thin film is exemplified as a work piece necessary to obtain the wire grid polarization element. However, it should be understood that the work piece is not limited to this, is arbitrarily selected in accordance with the microstructures to be obtained. For example, a dielectric multilayer film also can be used.

The antireflection film 102 functions to suppress a rear reflection of the interference light upon exposing the photosensitive film 103 by the above-mentioned interference light. For the antireflection film 102, both inorganic materials and organic materials can be employed that can suppress the reflection of the interference light by absorbing the interference light, etc. Particularly, an organic material, such as DUV 44, available from Nissan Chemical Industries, Ltd., etc., makes separations (removals) in later process easier. As a result, a good pattern without an interference standing wave can be formed.

The photosensitive film 103 is formed using a material having the following characteristic: a part received light irradiation is changed its characteristics, and either the light irradiated part or a part received no light irradiation can be selectively removed by a predetermined processing in a later process. For example, in the exemplary embodiment, the photosensitive film 103 is formed using a chemical amplification resist adjusted to UV wavelengths (λ: to 250 nm).

Figure 3:
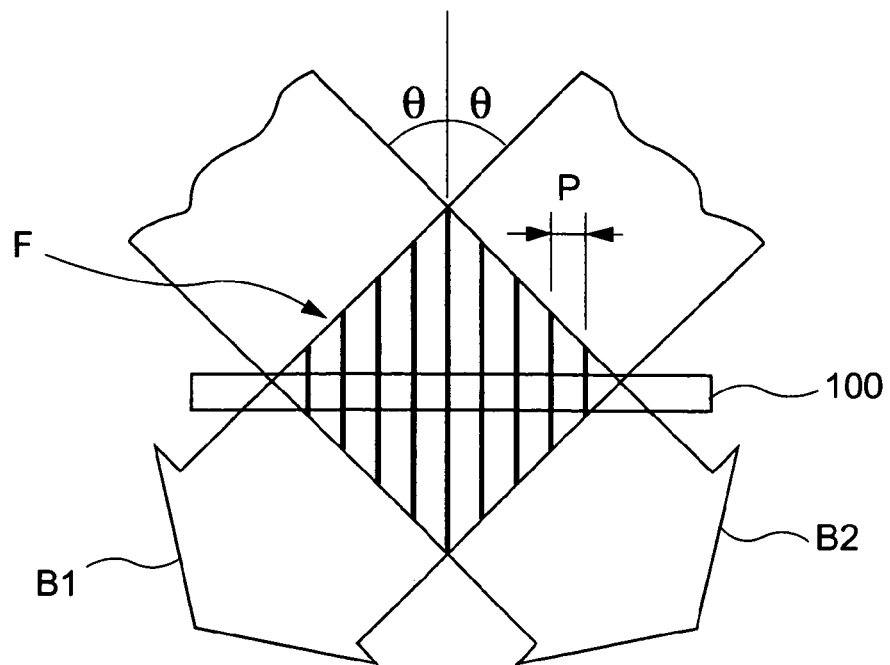
FIG. 3 is an explanatory diagram illustrating interference light generated by intersecting two laser beams.

FIG. 3 is an explanatory diagram illustrating the interference light generated by intersecting the two laser beams B1 and B2. As mentioned above, in the exemplary embodiment, the interference light (interference fringes) is generated by interfering each of the laser beams B1 and B2 whose beam diameter is expanded, at a predetermined intersection angle. Then, an exposure is performed by irradiating the interference fringes to the photosensitive film 103.

A period P of interference fringes F (refer to FIG. 3) is given by the following formula.

$$P = \lambda/(2 \sin \theta) \quad \text{Formula 1}$$

where λ is the laser wavelength and θ is the intersection angle.

In this case, as shown in FIG. 3, the two laser beams B1 and B2 are reached an exposure surface of the photosensitive film 103 symmetrically to an axis (virtual axis) normal to the exposure surface. This allows the exposed depth, and the width of a region to be exposed, and a pitch of an exposed pattern (a latent image), etc., to be more evenly provided. Accordingly, line patterns that are arranged at an equal interval, etc., can easily be obtained. Alternatively, the two laser beams B1 and B2 may be reached the exposure surface of the photosensitive film 103 unsymmetrically to the axis normal to the exposure surface.

Figure 4A:
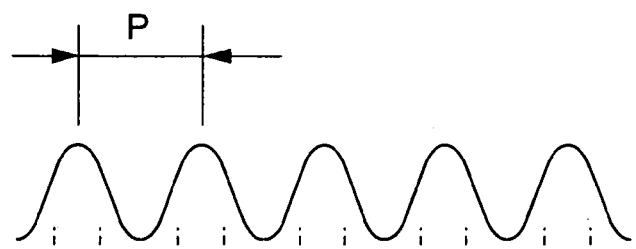
FIGS. 4A and 4B are explanatory diagrams illustrating the relationship between the interference light and a latent image formed to a photosensitive film.
Figure 4B:
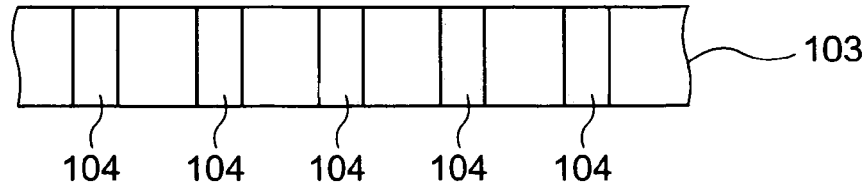

FIGS. 4A and 4B are explanatory diagrams illustrating a relationship between the interference light and the latent image formed to the photosensitive film 103. As shown in FIG. 4A, the interference light exhibits a periodical light intensity distribution (the period P). As shown in FIG. 4B, a latent image pattern 104 is formed to the photosensitive film 103 in response to intensity of irradiated light.

Figure 5:
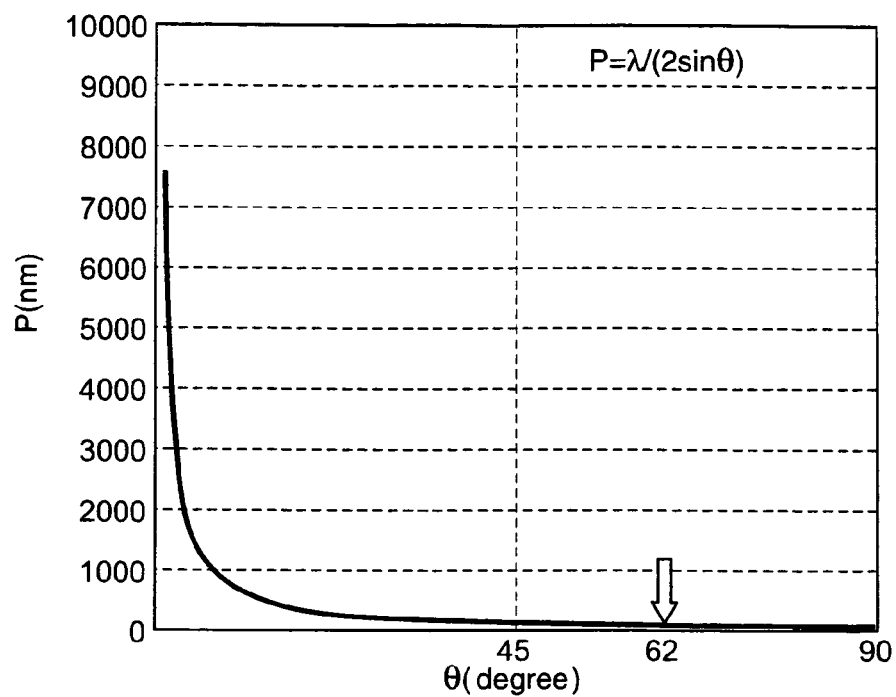
FIG. 5 is a diagram (graph) illustrating the relationship of the formula 1.

FIG. 5 is a diagram (graph) illustrating the relationship of the formula 1. The horizontal axis corresponds to the intersection angle θ, while the vertical axis corresponds to the period (pitch) P of the interference fringes. As shown in FIG. 5, for example, if wavelength λ is 266 nm, the period P of the interference fringes is 150 nm, where the intersecting angle θ is 62 degrees. The period of the interference light, theoretically, can be achieved at approximately half of the wavelength of each laser beam.

The depth ΔZ of a region in which the interference fringes are formed is nearly given by the following formula.

$$\Delta Z < W/\sin\theta \qquad \text{Formula 2}$$

where W is the diameter of an incident beam.

Both the two laser beams B1 and B2 related to the interference are linearly polarized. The direction is perpendicular to the surface defined by the two laser beams B1 and B2 (TE polarization). Using the TE polarization, clear interference fringes can be made regardless of the intersection angle.

Figure 6:
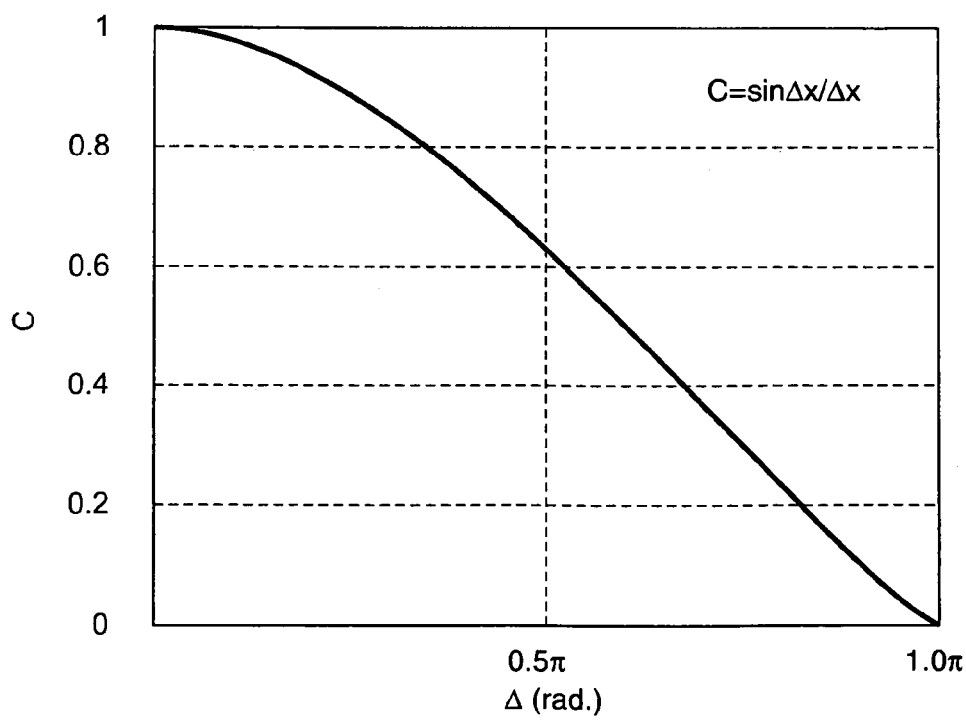
FIG. 6 is a diagram (graph) illustrating the relationship of the formula 3.

In order to form a good shaped resist pattern (having a high aspect ratio and rectangular shape), highly increasing a contrast of the interference fringes is indispensable. A contrast C of the interference fringes is given by the following formula. FIG. 6 is a diagram (graph) illustrating the relationship of the formula.

$$C = \sin(\Delta_x)/(\Delta_x) \qquad \text{Formula 3}$$

where Δx is the displacement of the interference fringes.

For increasing the contrast of the interference fringes, the displacement of the interference fringes in an exposure should be suppressed as small as possible. In order to achieve this, disturbance (vibrations or air currents) is required to be eliminated. For example, measures are taken in which the exposure system shown in FIG. 1 is placed on a vibration isolation bench, and further the exposure system is covered with a cover, etc., leading to huge effects.

Next, a method for manufacturing according to the first exemplary embodiment of the invention will be minutely described by taking a wire grid polarization element as an example of the microstructures.

FIGS. 7A-7F are process sectional views explaining the method for manufacturing a microstructure according to the first exemplary embodiment of the invention.

Figure 7A:
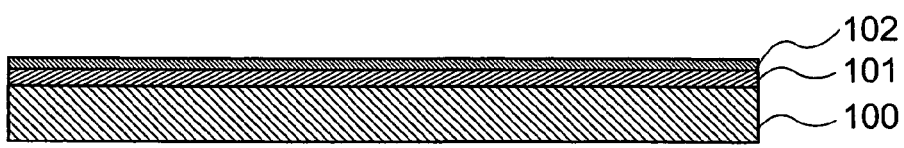
FIGS. 7A-7F are process sectional views explaining a method for manufacturing a microstructure.

First, as shown in FIG. 7A, the metal thin film 101 and the antireflection film 102 can be formed on one surface of the substrate 100. In this case, a glass substrate having a thickness of 1 mm is used as the substrate 100. For the metal thin film 101, an aluminum film is formed to a thickness of approximately 160 nm by a film forming method such as sputtering or vacuum evaporating, etc. The antireflection film 102 is formed to a thickness of approximately 75 nm by a film forming method such as spin coating, etc.

Figure 7B:
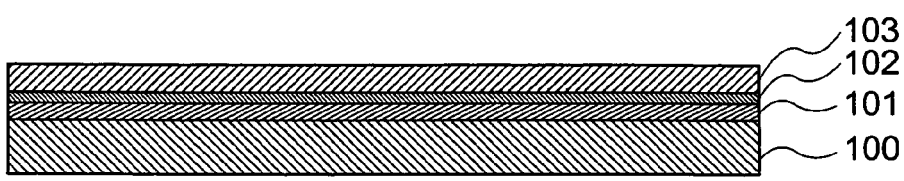

Next, as shown in FIG. 7B, the photosensitive film 103 can be formed above the metal thin film 101 serving as a work piece (in this case, on a surface of the antireflection film 102). In the exemplary embodiment, the photosensitive film 103 having a thickness of approximately 450 nm is formed by a film forming method, such as spin coating, etc., using a chemical amplification resist. Here, the chemical amplification resist, which is a mixed liquid composed of a resin, an acid generating agent, and a solvent, utilizes an acid generated by a photochemical reaction. Thus, the resist is sensitively influenced by a small amount of alkali impurities such as ammonia, etc., fluctuating its characteristics. Therefore, in the exemplary embodiment, a concentration of alkali impurities is controlled one part per billion (ppb) and below in an atmosphere in which this process, and succeeding processes, i.e., an exposure process, and a development process, are performed.

It is preferable that a protective film forming process is added that forms a protective film on a surface of the photosensitive film 103, after forming the photosensitive film. For example, a preferable protective film can be formed by spin coating, etc., using TSP-5A, available from Tokyo Ohka Kogyo Co., Ltd. The protective film also can function as antireflection. This allows the photosensitive film 103 made of the photochemical amplification resist to be isolated from air so that influences from surroundings can be suppressed.

Figure 7C:
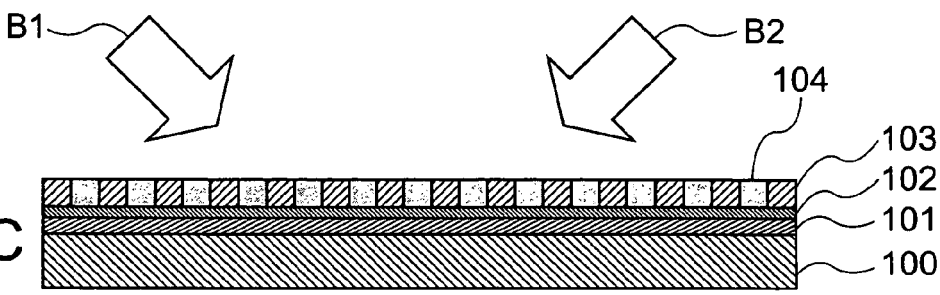

Next, as shown in FIG. 7C, interference light is generated by intersecting the two laser beams B1 and B2 having a wavelength shorter than a wavelength of visible light (in this case, 266 nm) at a predetermined angle. The photosensitive film 103 is exposed by irradiating the interference light. For example, the interference fringes having a period of 150 nm are obtained by the two laser beams B1 and B2 that are intersected at an angle of 62 degrees (refer to FIG. 3). The latent image pattern 104 that corresponds to the interference fringes (interference light) is formed to the photosensitive film 103. In this case, since the laser beams B1 and B2 are used whose beam diameters are expanded to approximately 200 mm by beam expanders, a region of nearly 4 inches can be exposed at one time. The exposure takes around 30 seconds. If a larger region (e.g., nearly 8 inches) is required to be exposed, the substrate 100 may be moved by step and repeat.

Figure 7D:
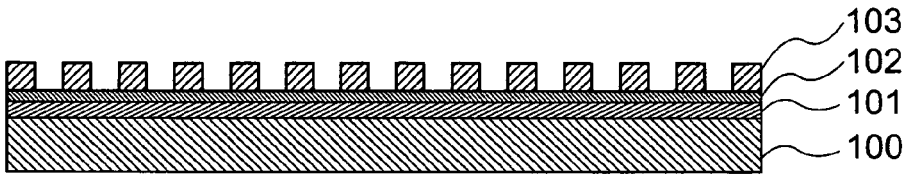

Next, as shown in FIG. 7D, the photosensitive film 103 after the exposure is baked (baking). Subsequently, by performing a development, a shape corresponding to the pattern of the interference light is developed to the photosensitive film 103. As a result, a resist pattern having a period of 150 nm is obtained on the metal thin film 101.

Figure 7E:
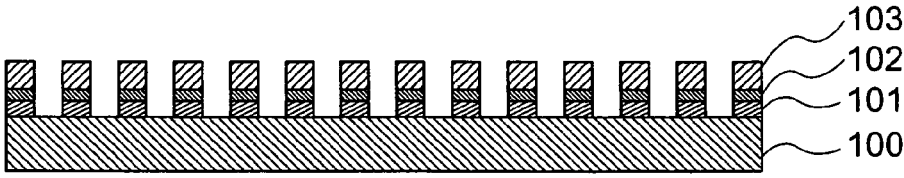

Next, as shown in FIG. 7E, the metal thin film 101 serving as the work piece is processed by etching using the photosensitive film 103 after the development as an etching mask. As a result, the resist pattern is transferred to the metal thin film 101. For the etching methods, in principle, both wet etching and dry etching can be employed. In particular, it is preferred that the dry etching is performed by means of inductively coupled plasma (ICP) or electron cyclotron resonance (ECR), etc. Removing the antireflection film 102 before etching allows repeatability or uniformity of etching to be further improved.

Figure 7F:
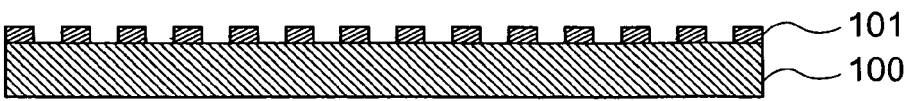

Next, as shown in FIG. 7F, the antireflection film 102 and the photosensitive film 103 are removed. As a result, a wire grid polarization element composed of a fine aluminum pattern.

Figure 8:
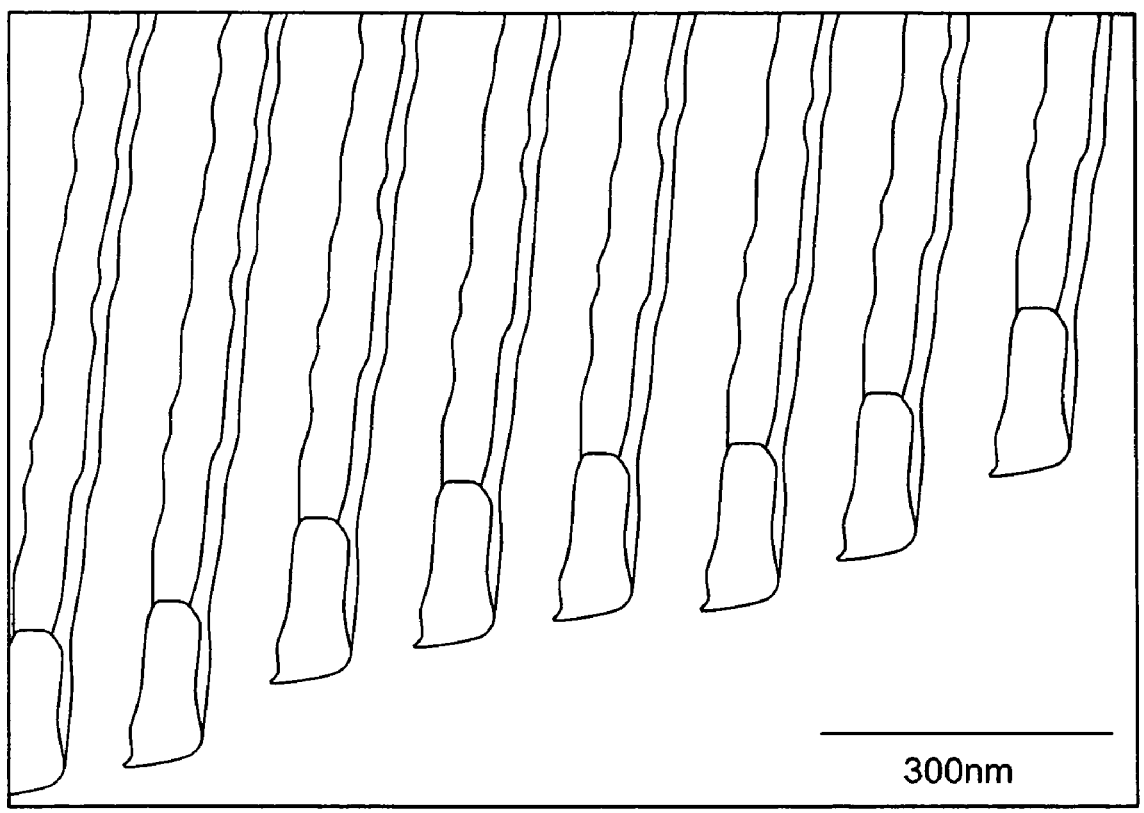
FIG. 8 is a rough perspective view illustrating a microstructure (a wire grid polarization element)

FIG. 8 is a rough perspective view illustrating a microstructure (a wire grid polarization element) manufactured by a method for manufacturing according to the exemplary embodiment of the invention. With above-mentioned conditions, as shown in FIG. 8, a wire grid polarization element is obtained in which a fine aluminum pattern of a stripe like having a period of 150 nm, a pattern depth of 250 mn, and a duty of 1:1 is formed on the glass substrate.

Figure 9A:
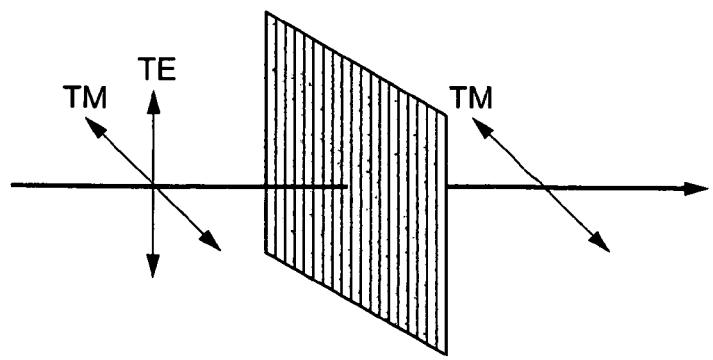
FIGS. 9A-9C are explanatory diagrams illustrating optical characteristics of the wire grid polarization element.
Figure 9B:
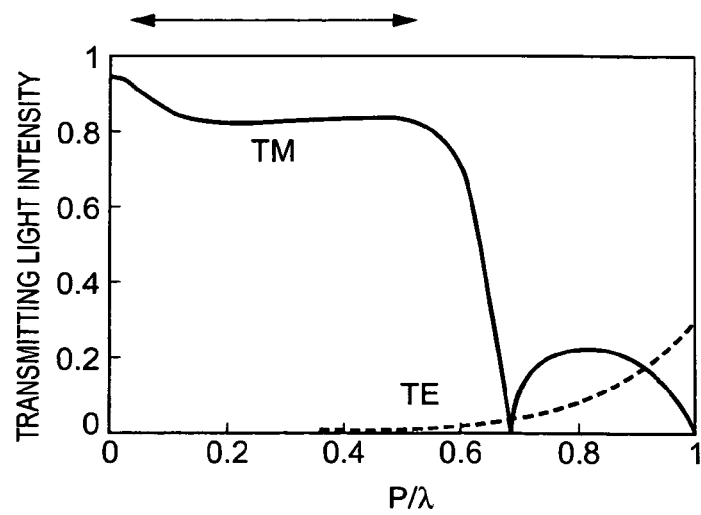
Figure 9C:
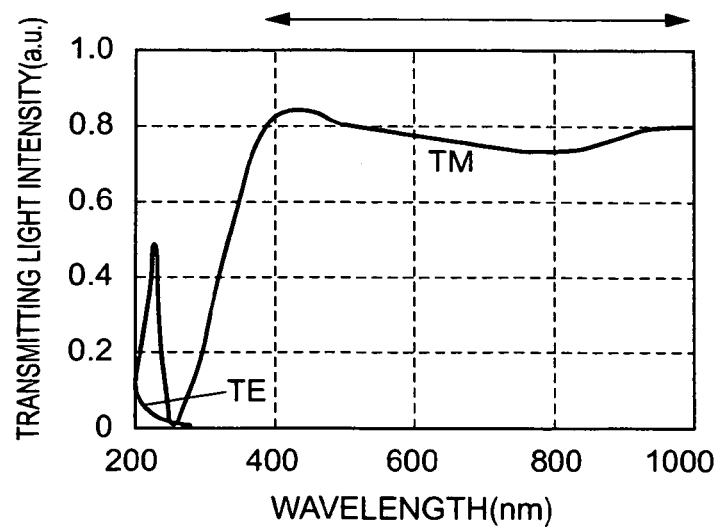

FIGS. 9A-9C are explanatory diagrams illustrating optical characteristics of the above-mentioned wire grid polarization element. More specifically, FIG. 9A is an explanatory diagram illustrating a relationship between the wire grid polarization element and incident light and outgoing light, FIG. 9B is a diagram illustrating transmission light intensity where the wavelength λ is a fixed value, while the period P is varied, and FIG. 9C is a diagram illustrating transmission light intensity where the period P is a fixed value, while the wavelength λ is varied. In each region indicated with the arrow of FIGS. 9B and 9C, a significant polarization separation characteristic is observed between TE component and TM component (refer to FIG. 9A). Such wire grid polarization element is so superb in light stability in addition to polarization characteristics that it can be applied to electronic apparatuses such as, for example, a liquid crystal projector, etc. Conventional polarization elements using polymers have a disadvantage in that their characteristics are significantly deteriorated by long time irradiation with a high-intensity lamp, thereby hindering liquid crystal projectors to prolong their operating life. However, using the polarization element according to the exemplary embodiment allows liquid crystal projectors to prolong their operation life.

Figure 10A:
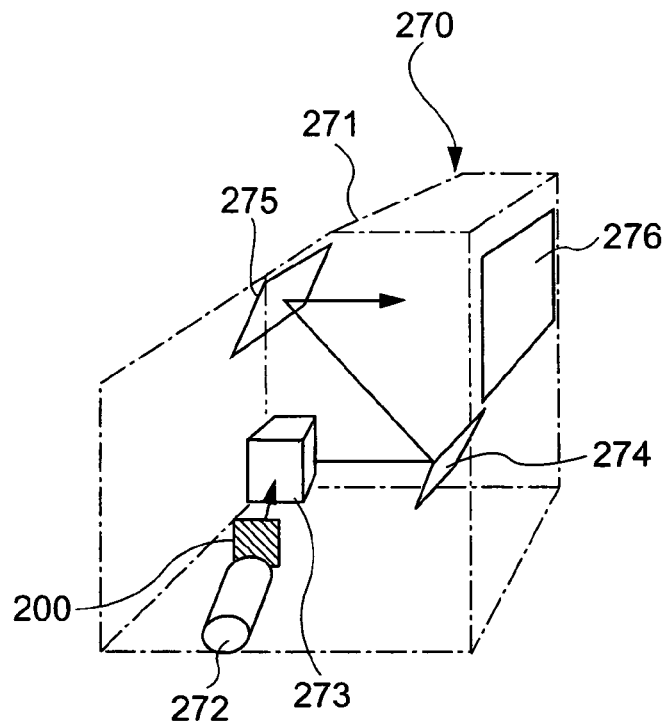
FIGS. 10A and 10B are explanatory diagrams illustrating specific examples of electronic apparatuses.
Figure 10B:
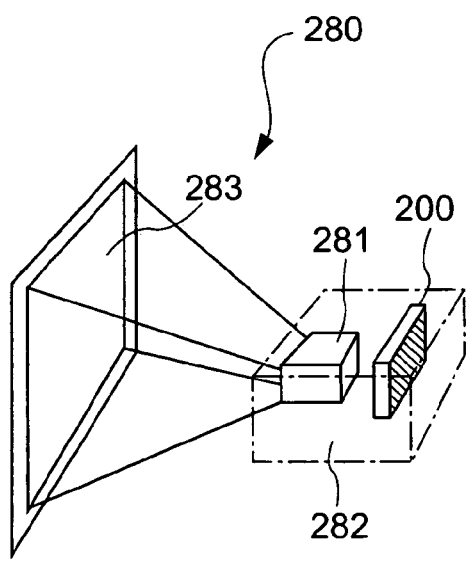

FIGS. 10A and 10B are explanatory diagrams illustrating a specific example of electronic apparatuses. FIG. 10A is a rear projector as an application example. A projector 270 can include a case 271, a light source 272, a combining optical system 273, mirrors 274 and 275, a screen 276, and a liquid crystal panel 200 including a wire grid polarization element according to the embodiment. FIG. 10B is a front projector as another application example. A projector 280 can include an optical system 281 and a liquid crystal panel 200 including a wire grid polarization element according to the embodiment in a case 282. The projector displays images on a screen 283. It should be understood that electronic apparatuses are not limited to these examples, other examples may include fax-machines built-in displays, digital camera finders, mobile TVs, electronic notebooks, electronic bulletin boards, and advertising displays.

As mentioned above, in the first exemplary embodiment, by intersecting the two laser beams B1 and B2 at a certain degree of angle, interference light (interference fringes) is obtained that has a contrasting (light intensive distribution) having a pitch of the same level or smaller than of the wavelength of the laser beam. Utilizing such interference light for an exposure allows manufacturing equipment to be drastically simplified. Therefore, fine processing in the order of wavelength shorter than a wavelength of visible light can be realized with low costs.

Also, according to the first exemplary embodiment, the exposure process has a wide process margin and a high throughput, thereby enabling it to be easily applied in mass production lines.

In addition, according to the first exemplary embodiment, an exposed region having a relatively large area is also easily applicable. For example, even though a region of nearly 8 inches can be processed in a short time.

It should be noted that the invention is not limited to the above-mentioned exemplary embodiment, and various modifications and changes can be made without departing from the spirit and scope of the invention.

For example, in the first exemplary embodiment, the work piece is the metal thin film. Other substrates (e.g., quartz or silicon), etc., can be served as the work piece. In this case, a photosensitive film may be formed above the substrate, then an exposure, a development, and an etching may be performed. Further, a film or a substrate having photosensitivity may be served as the work piece.

Figure 11A:
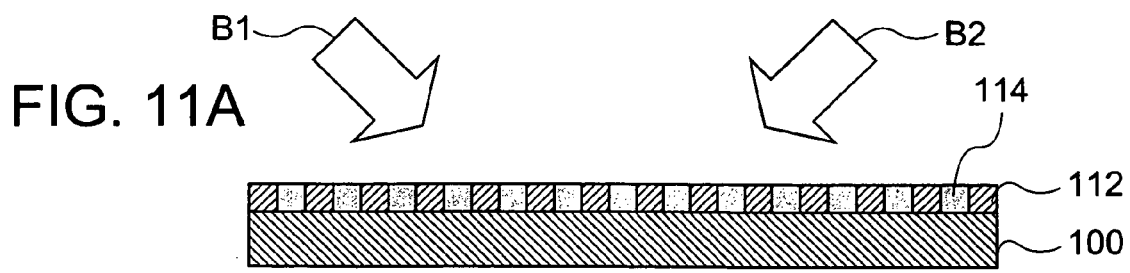
FIGS. 11A and 11B are process sectional views illustrating a case in which a film having photosensitivity serves as a work piece.
Figure 11B:
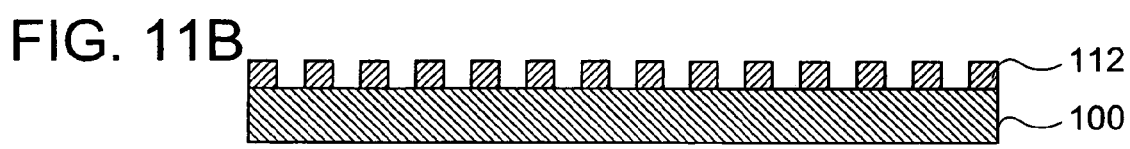

FIGS. 11A and 11B are process sectional views illustrating a case in which a film having photosensitivity is served as the work piece. Only relevant processes are partially illustrated. Here, it is preferable that a film made of polyimide resin, etc., is employed as a photosensitive film 112. As shown in FIG. 11A, like wise the above-mentioned exemplary embodiment, the photosensitive film 1 12 serving as the work piece provided on the substrate 100 is exposed by irradiating the interference light obtained by intersecting two laser beams. As a result, a latent image pattern 114 is formed. Then, the exposed part is developed so as to develop a concavo-convex shape corresponding to a pattern of the interference light. As a result, as shown in FIG. 11B, a fine concavo-convex pattern is formed to the photosensitive film 112. Such concavo-convex pattern can be used as, for example, an antireflection structure such as so-called moth eye, etc.

Figure 12A:
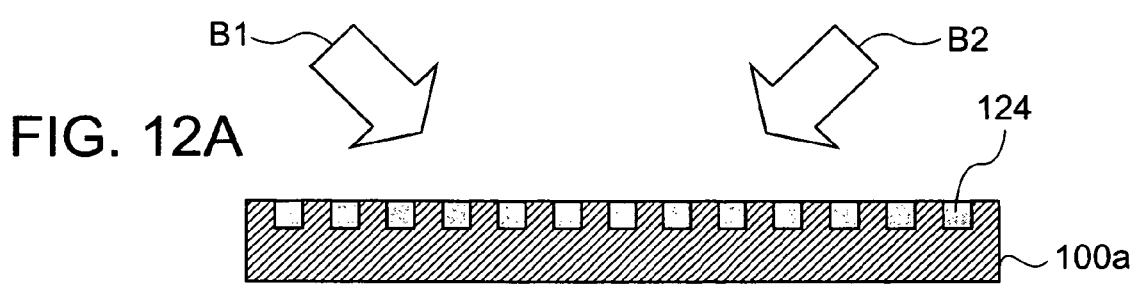
FIGS. 12A and 12B are process sectional views illustrating a case in which a substrate having photosensitivity serves as a work piece.
Figure 12B:
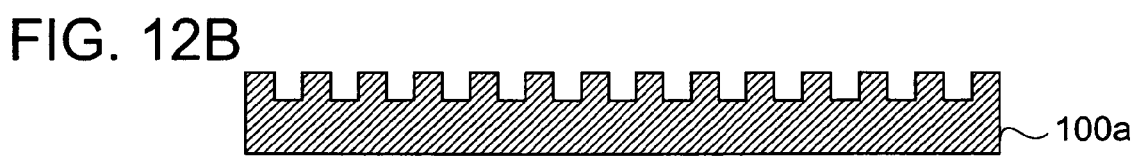

FIGS. 12A and 12B are process sectional views illustrating a case in which a substrate having photosensitivity is served as the work piece. Only relevant processes are partially illustrated. Here, the substrate 100 made of an acrylic resin having photosensitivity, etc., is served as the work piece. As shown in FIG. 12A, like wise the above-mentioned exemplary embodiment, the substrate 100a serving as the work piece is exposed by irradiating interference light obtained by intersecting two laser beams. As a result, a latent pattern 124 is formed in juxtaposition of the surface of the substrate 100a. Then, the exposed part is developed so as to develop a concavo-convex shape corresponding to a pattern of the interference light. As a result, as shown in FIG. 12B, a fine concavo-convex pattern is formed to the surface of the substrate 100a. Such concavo-convex pattern can be used as, for example, an antireflection structure such as so-called moth eye, etc.

In the above-mentioned exemplary embodiment, a beam generation unit is constructed in which two laser beams are generated by combining the laser light source and the branching unit (diffractive beam splitter). However, the beam generation unit is not limited to this. For example, the beam generation unit according to the embodiment can be constructed by using two laser light sources each of which outputs one laser beam. In addition, two laser beams also can be generated using a diffractive element that will be described below.

Figure 13:
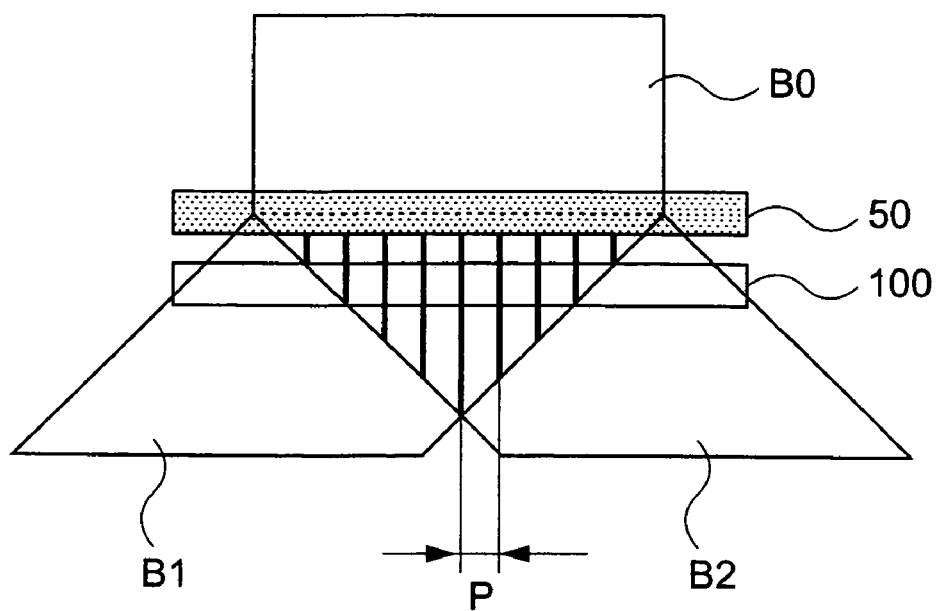
FIG. 13 is an explanatory schematic view illustrating an example of a method for generating a laser beam using a diffractive element.

FIG. 13 is an explanatory schematic view illustrating an example of a method for generating a laser beam using a diffractive element. In a diffractive element 50 shown in FIG. 13, both oppositely facing surfaces are processed as a stripe concavo-convex shape (one-dimensional lattice), the laser beam B0 reaching one surface. The depth and period of the concavo-convex shape are optimally designed by a vector analysis so that plus first-order diffractive beam and minus first-order diffractive beam are mainly generated based on the laser beam B0 reaching nearly normal to the surface as shown in FIG. 13. Using plus/minus first-order diffractive beams as the two laser beams B1 and B2, the interference light having pitch P can be generated so as to perform an exposure.

Figure 14:
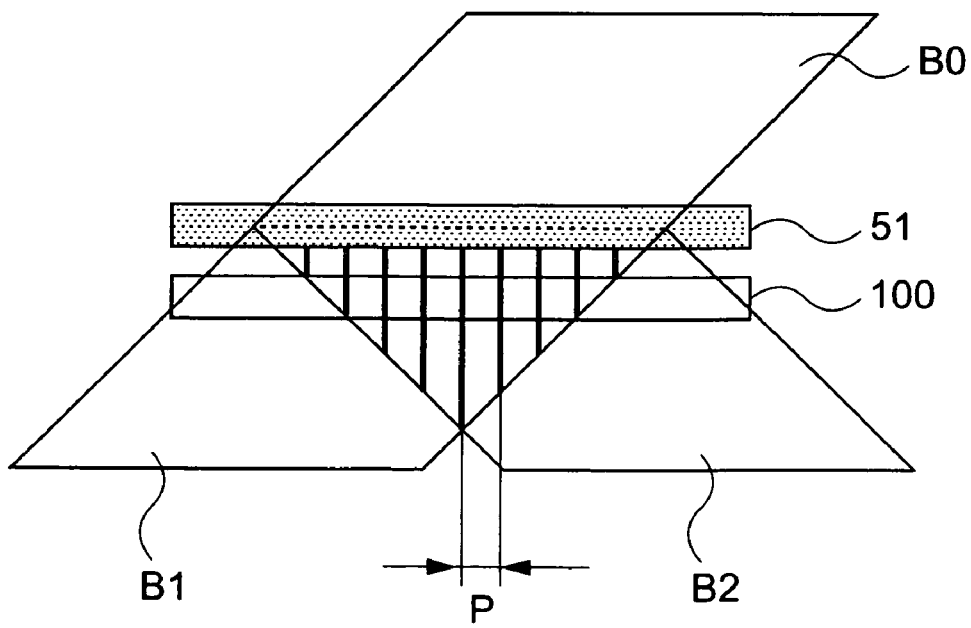
FIG. 14 is an explanatory schematic view illustrating another example of a method for generating a laser beam using a diffractive element.

FIG. 14 is an explanatory schematic view illustrating another example of a method for generating a laser beam using a diffractive element. In a diffractive element 51 shown in FIG. 14, both oppositely facing surfaces are processed as a stripe concavo-convex shape (one-dimensional lattice), the laser beam B0 reaching one surface. The depth and period of the concavo-convex shape are optimally designed by a vector analysis so that one transmission beam and one diffractive beam traveling a different direction from the transmission beam are mainly generated based on the laser beam B0 reaching the surface at a predetermined angle as shown in FIG. 14. Using the transmission beam and the diffractive beam as the two laser beams B1 and B2, the interference light having pitch P can be generated so as to perform an exposure.

In a case where the diffractive element 50 or the diffractive element 51 are used, in the optical system shown in FIG. 1, the laser beam B0 after passing through the shutter 13 reaches the diffractive element 50 or the diffractive element 51, and the substrate 100, etc., is disposed close to the diffractive element 50 or the diffractive element 51. The substrate 100 may be disposed close to the diffractive element 50 or the diffractive element 51 with a distance of approximately 1 mm between them. Also, it is preferable that the incident laser beam B0 is linearly polarized so that its polarization direction is parallel with a groove of the concavo-convex shape of the diffractive element 50 or the diffractive element 51. As a result, interference light can be efficiently generated. The beam diameter of the incident laser beam B0 may be expanded using a beam expander, etc., in advance. For example, by expanding the beam diameter to approximately 200 mm, a region in a diameter of approximately 8 inches can be exposed at one time. If it is difficult to expand the beam diameter, the laser beam B0 may be scanned on the diffractive element 50. Using the diffractive element 50 or the diffractive element 51 allows exposure devices to be further simplified, and production costs to be reduced.

The diffractive element 50 or 51 corresponds to the branching unit in the invention, and also functions as the optical unit that intersects two laser beams at a predetermined angle.

In the above-mentioned exemplary embodiment, a spherical wave that is generated by the beam expander composed of the lens and the spatial filter is used for an interference exposure. However, disposing a collimating lens after the beam expander allows a plane wave to be used for the interference exposure. In addition, a variety of fine patterns can be achieved by applying a phase modulation to at least one wavefront, using different types of optical element (lenses, phase plates, computer generated holography, etc.).

In the above-mentioned exemplary embodiment, the chemical amplification resist is used as the photosensitive film. However, it should be understood that the photosensitive film is not limited to this. For example, a self-assembled monolayer film also can be used. The self-assembled monolayer film has an advantage in that less material consumption due to its ultra thin film, and various functions can be demonstrated, thereby enabling variations of formed microstructures to be increased. For example, using a material having low surface free energy such as fluoroalkylsilane, lyophilic and lyophobic patterns are formed on the substrate. As a result, films can selectively be formed on the pattern. Also, using aminopropyltriethoxysilane, mercaptotriethoxysilane, etc., electroless plating also can be selectively performed on the self-assembled monolayer film that remains after exposing. In a case where the self-assembled monolayer film is used as above, it could function as the microstructure even though the etching process is not included.

Figure 15:
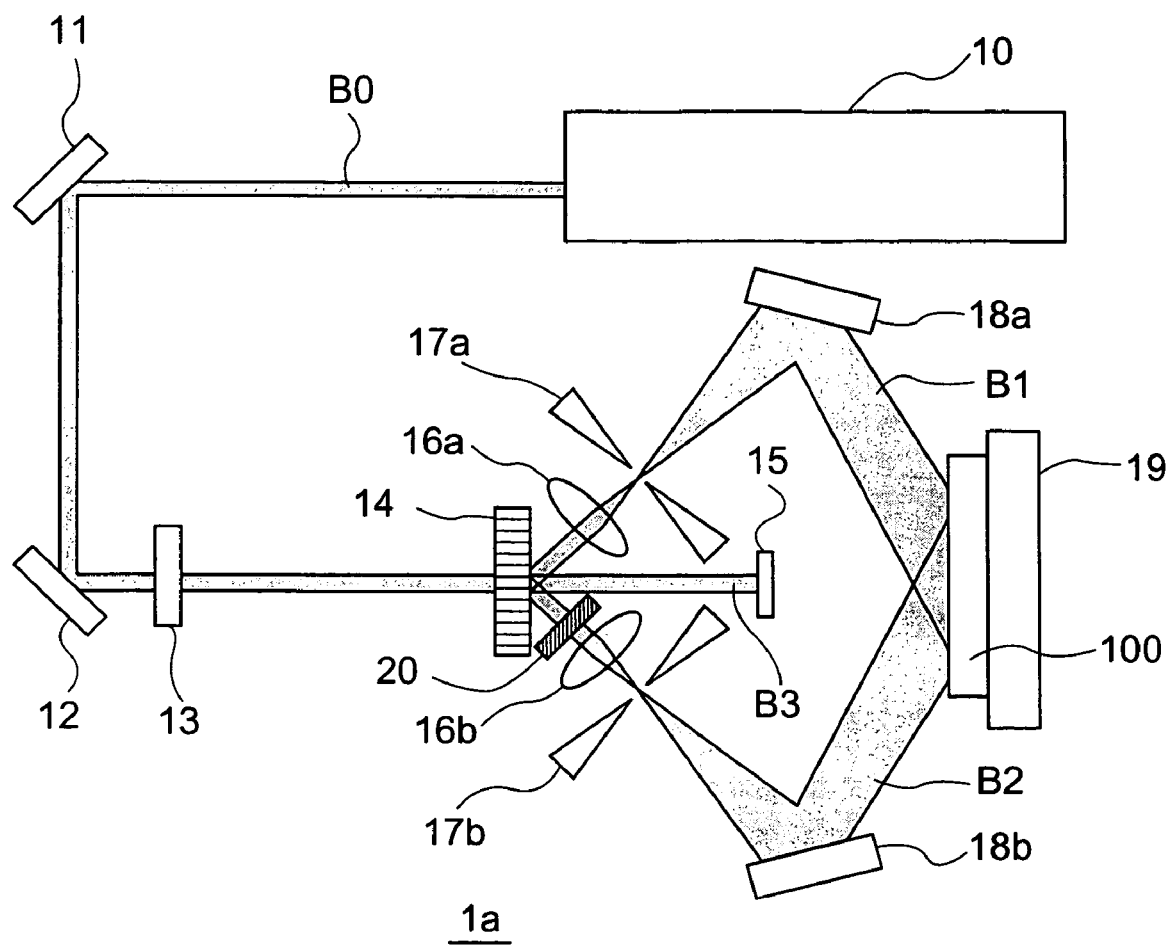
FIG. 15 is an explanatory diagram illustrating a construction of an exposure device according to a second exemplary embodiment of the invention.

FIG. 15 is an explanatory diagram illustrating a construction of an exposure device according to a second exemplary embodiment of the invention. An exposure device 1a shown in FIG. 15 is used for exposing a photosensitive film formed on one surface of the substrate 100. The exposure device 1a includes a laser light source 10, mirrors 11 and 12, a shutter 13, a diffractive beam splitter 14, a monitor 15, lenses 16a and 16b, spatial filters 17a and 17b, mirrors 18a and 18b, a stage 19, and a phase modulation unit 20. The exposure device 1a, which basically includes the same construction as that of the exposure device 1 according to the first exemplary embodiment, differs in that the phase modulation unit 20 is added. Below, explanations on contents overlapped with the first embodiment will be omitted.

The phase modulation unit 20 is disposed in the path of one laser beam B2 to apply a phase modulation to the laser beam B2. A phase difference between the two laser beams B1 and B2 can be controlled by the phase modulation unit 20. In this case, while the phase modulation unit 20 is disposed only in the path of one laser beam B2, the phase modulation unit may be disposed in the path of each laser beam.

Here, A light intensity distribution (interference fringes) I of the interference light is given by the following formula.

$$I = I_1 + I_2 + 2\sqrt{(I_1 I_2} \cos(\phi))$$ Formula 4 where $I_1$ and $I_2$ are complex amplitudes of wavefronts of two beams related to the interference.

Figure 16A:
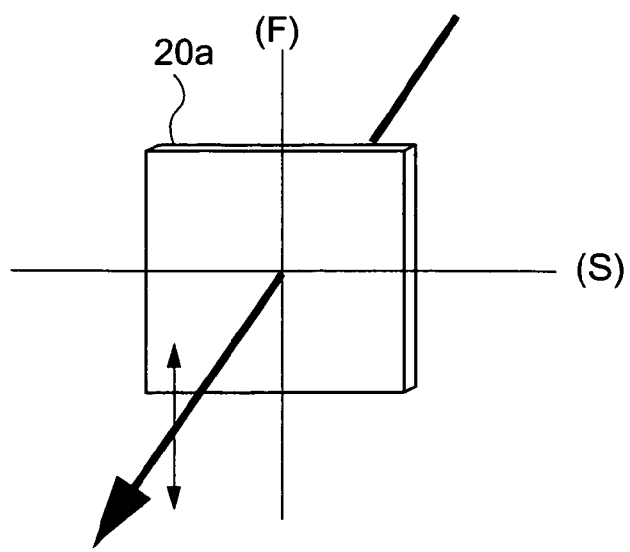
FIGS. 16A and 16B are explanatory diagrams illustrating specific examples of phase modulation unit.
Figure 16B:
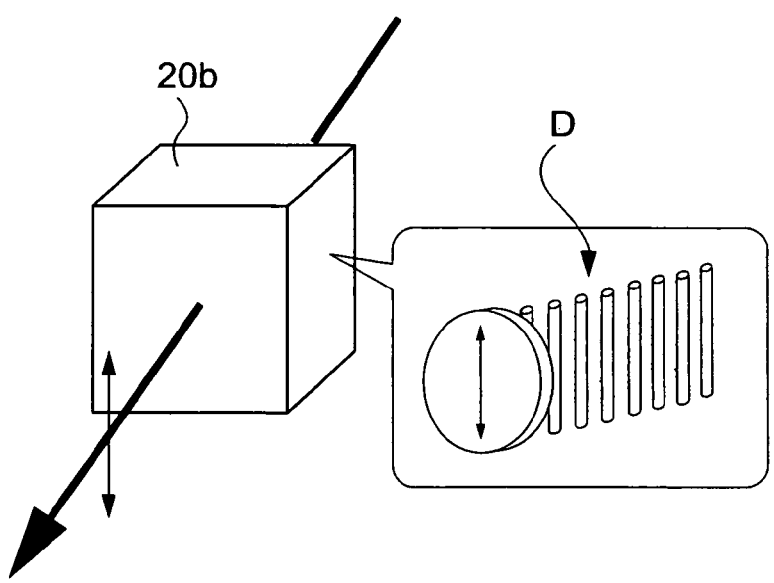

The phase difference between the laser beams is $\phi$. The phase difference $\phi$ is controlled by the phase modulation unit 20. As for the phase modulation unit, a ½ wavelength plate 20a as shown in FIG. 16A, and a liquid crystal spatial light modulator 20b as shown in FIG. 16B, etc., are preferably used. As shown in FIG. 16A, the ½ wavelength plate includes a fast phase axis (F in FIG. 16A) and a slow phase axis (S in FIG. 16A). By adjusting an incident polarization direction of the incident beam to one axis firstly, then to the other axis subsequently, the phase $\phi$ of the beam wavefront passing through the ½ wavelength plate can be shifted just $\pi$. As a result, the interference fringes can be displaced by half of the period. Alternatively, the liquid crystal spatial light modulator 20b includes a liquid crystal layer in which liquid crystal molecules are homogeneously aligned, and a polarizer that has the main axis in a direction in parallel with the longitudinal direction of the liquid crystal molecules, and is disposed at light outgoing side.

The liquid crystal spatial light modulator 20b is disposed so that a linearly polarized beam is reached that is in parallel with alignment direction (director) D of liquid crystal molecules in an initial alignment condition (no voltage is supplied). Director deformation occurs in response to an applied voltage so as to change a birefringence in the liquid crystal layer, whereby the phase $\phi$ of the beam wavefront passing through the liquid crystal layer can be continuously changed. That is, the interference fringes can be continuously displaced by controlling the voltage applied to the liquid crystal spatial light modulator 20b. For the liquid crystal layer, one can be employed that is in other alignment condition than the homogeneous alignment, as long as the birefringence can be changed in response to the applied voltage.

Figure 17A:
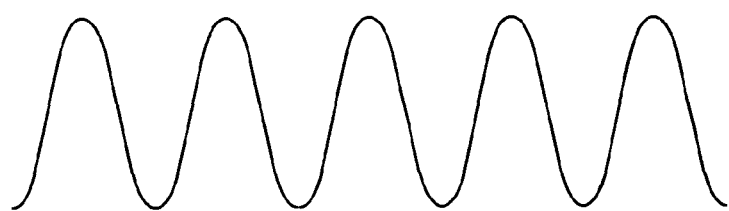
FIGS. 17A-17E are explanatory views illustrating a principle of a multiple-exposure.
Figure 17B:

FIGS. 17A and 17B are explanatory views illustrating a principle of a multiple-exposure. In the second exemplary embodiment, an exposure with a resolution of significantly smaller than the wavelength of the laser beam used for the exposure can be achieved by the following manner: the exposure principle using interference light is utilized that is described in the first exemplary embodiment with reference to FIG. 4; a resist having a multiphoton absorption characteristic is used for the photosensitive film 103 so that a latent image pattern is further sharpened; and a multiple-exposure is performed by displacing an occurrence position of interference light at each exposing time.

Figure 17C:
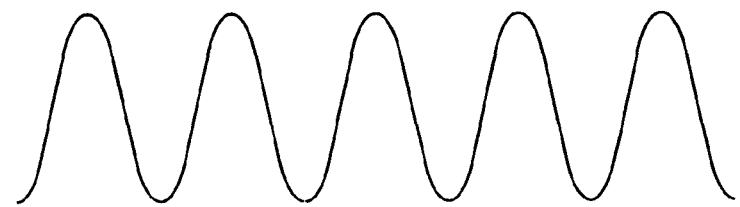
Figure 17D:
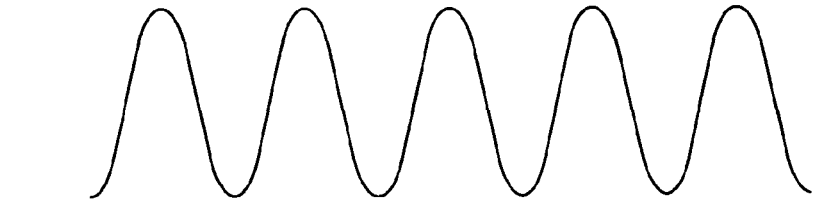
Figure 17E:
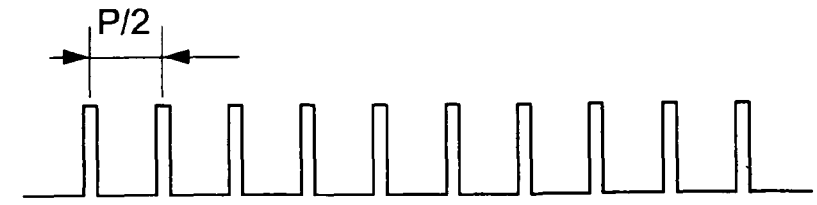

Specifically, by performing one time exposure with the interference light having the light intensity distribution shown in FIG. 17A, the latent image pattern having pitch P corresponding to the light intensity distribution of the interference light is obtained as shown in FIG. 17B. In this case, using a multiphoton absorption resist as the photosensitive film 103, the latent image formed after exposing is formed only adjacent to a part where the irradiated light intensity demonstrates the maximum as shown in FIG. 17B due to a nonlinearity of the resist. Therefore, a latent image pattern having a period of half of the interference fringes (P/2) can be formed inside the multiphoton absorption resist as shown in FIG. 17E by the following manner: the multiphoton absorption resist is firstly exposed by the interference light having pitch P (shown in FIG. 17C); then, the second exposure is performed by the interference light in which the interference fringes are displaced by half of the period by the phase modulation unit 20. Upon developing the latent image pattern, a fine concavo-convex pattern having the period P/2 can be formed.

Next, a method for manufacturing according to the second embodiment of the invention will be minutely described by taking a wire grid polarization element as an example of the microstructures.

FIGS. 18A-18G are process sectional views explaining the method for manufacturing a microstructure according to the second embodiment of the invention.

Figure 18A:
FIGS. 18A-18G are process sectional views explaining a method for manufacturing a microstructure.

Firstly, as shown in FIG. 18A, the metal thin film 101 and the antireflection film 102 are formed on one surface of the substrate 100. In this case, a glass substrate having a thickness of 1 mm is used as the substrate 100. For the metal thin film 101, an aluminum film is formed to a thickness of approximately 160 nm by a film forming method such as sputtering or vacuum evaporating, etc. The antireflection film 102 is formed to a thickness of approximately 75 nm by a film forming method such as spin coating, etc.

Figure 18B:
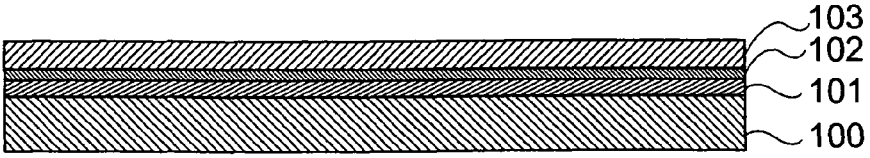

Next, as shown in FIG. 18B, the photosensitive film 103 is formed above the metal thin film 101 serving as a work piece (in this case, on a surface of the antireflection film 102). In the exemplary embodiment, the photosensitive film 103 having a thickness of approximately 450 nm is formed by a film forming method such as spin coating, etc., using a multiphoton absorption resist.

Figure 18C:
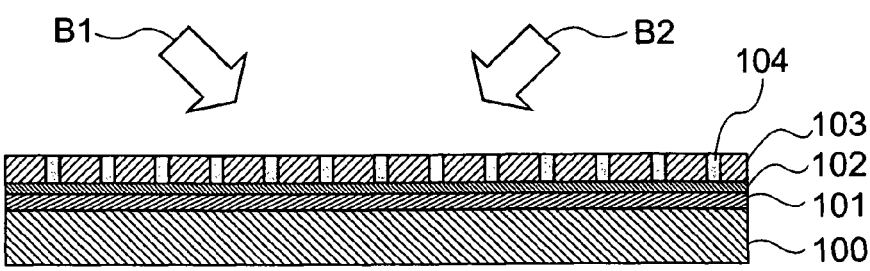

Next, as shown in FIG. 18C, interference light is generated by intersecting the two laser beams B1 and B2 having a wavelength shorter than a wavelength of visible light (in this case, 266 nm) at a predetermined angle. The photosensitive film 103 is exposed by irradiating the interference light. For example, the interference fringes having a period of 150 nm is obtained by the two laser beams B1 and B2 that are intersected at an angle of 62 degrees (refer to FIG. 3 and FIG. 5). The latent image pattern 104 that corresponds to the interference fringes is formed to the photosensitive film 103. In the exemplary embodiment, while the phase difference between the two laser beams B1 and B2 is zero, the phase difference is not limited to this.

Figure 18D:
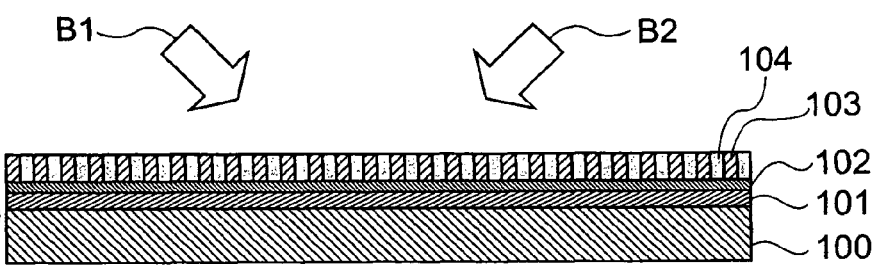

Next, as shown in FIG. 18D, interference light is generated by intersecting the laser beams B1 and B2 each other at a predetermined angle while a phase difference different from that in the first exposure process is applied between the two laser beams B1 and B2. Then, the photosensitive film 103 is exposed by irradiating the interference light. For example, as mentioned above, the interference fringes having a period of 150 nm is obtained by the two laser beams B1 and B2 that are intersected at an angle of 62 degrees (refer to FIG. 3). The latent image pattern 104 that corresponds to the interference fringes is formed to the photosensitive film 103. Here, for example, by shifting the phase φ of each of the laser beams B1 and B2 by π, i.e., by applying a phase difference of half of the wavelength, a new latent image pattern is formed at a position that is shifted by half of the pitch P from the latent pattern image in the first exposure process (refer to FIG. 17). Such multiple-exposure achieves the fine latent image pattern 104 having a period of approximately 75 nm. In addition, in a case where an element is used that can apply continuous phase modulation such as the liquid crystal spatial light modulators 20b modulators 20b (refer to FIG. 16B), the multiple-exposure can be repeated by displacing the phase φ with steps smaller than π. Therefore, a pattern having a period of further shorter than 75 nm can be manufactured.

In this case, since the laser beams B1 and B2 are used whose beam diameters are expanded to approximately 200 mm by beam expanders, a region of nearly 4 inches can be exposed at one time in the first and second exposure processes. The exposure takes around 30 seconds. If a larger region (e.g., nearly 8 inches) is required to be exposed, the substrate 100 may be moved by step and repeat. The multiple-exposure of 3 times or more may be repeated while the phase difference between laser beams is changed.

Figure 18E:
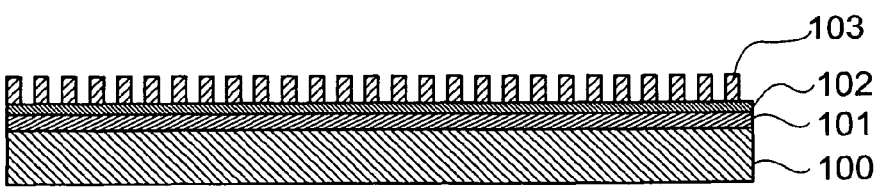

Next, as shown in FIG. 18E, the photosensitive film 103 after the exposure is baked (baking). Subsequently, by performing a development, a shape corresponding to the pattern of the interference light is developed to the photosensitive film 103. As a result, a resist pattern having a period of 75 nm is obtained on the metal thin film 101.

Figure 18F:
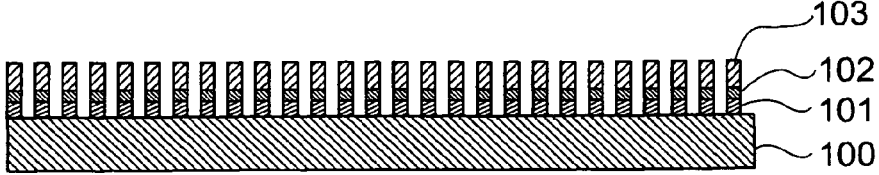

Next, as shown in FIG. 18F, the metal thin film 101 serving as the work piece is processed by etching using the photosensitive film 103 after the development as an etching mask. Accordingly, the resist pattern is transferred to the metal thin film 101. For the etching methods, in principle, both wet etching and dry etching can be employed. In particular, it is preferred that the dry etching is performed by means of inductively coupled plasma (ICP) or electron cyclotron resonance (ECR), etc.

Figure 18G:
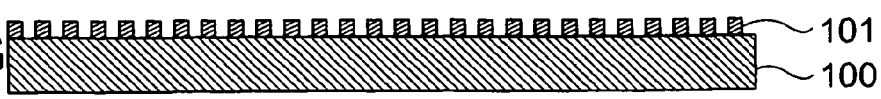

Next, as shown in FIG. 18G, the antireflection film 102 and the photosensitive film 103 are removed. As a result, a wire grid polarization element composed of a fine aluminum pattern is obtained.

Figure 19:
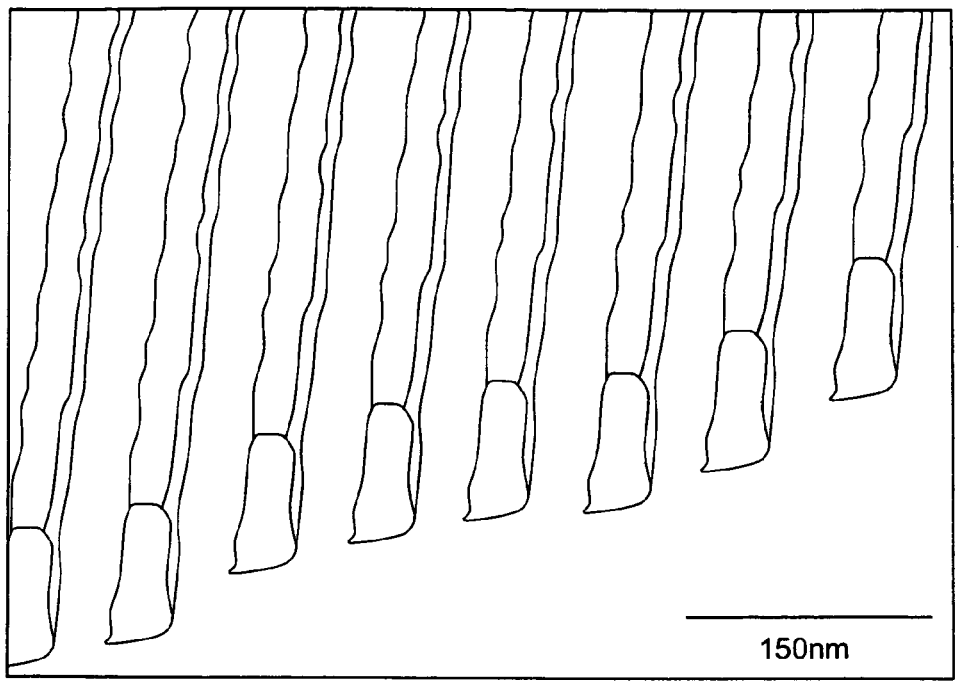
FIG. 19 is a rough perspective view illustrating a microstructure (a wire grid polarization element)

FIG. 19 is a rough perspective view illustrating a microstructure (wire grid polarization element) manufactured by a method for manufacturing according to the second exemplary embodiment. With above-mentioned conditions, as shown in FIG. 19, a wire grid polarization element is obtained in which a fine aluminum pattern of a stripe like having a period of 75 nm, a pattern depth of 250 nm, and a duty of 1:1 is formed on the glass substrate. The optical characteristics of the wire grid polarization element are the same as those of the first embodiment (refer to FIG. 9). Such wire grid polarization element is so superb in light stability in addition to polarization characteristics that it can be applied to electronic apparatuses such as, for example, a liquid crystal projector, etc., (refer FIG. 10). Polarization elements using polymers have a disadvantage in that their characteristics are significantly deteriorated by long time irradiation with a high-intensity lamp, thereby hindering liquid crystal projectors to prolong their operating life. However, using the polarization element according to the embodiment allows liquid crystal projectors to prolong their operation life.

As mentioned above, in the second exemplary embodiment, by intersecting the two laser beams B1 and B2 at a certain degree of angle, the interference light is obtained that has a light intensive distribution having a pitch of the same level or smaller than of the wavelength of the laser beam. Exposing with such interference light allows a fine latent image pattern to be formed with a simple device construction. Further, a finer latent image pattern can be formed by performing the multiple-exposure in which the phase difference between two laser beams is set to be changeable, while the interference light is displaced by a predetermined amount. Therefore, fine processing that is the order of wavelength shorter than a wavelength of visible light can be realized.

Also, according to the exemplary embodiment, the exposure process has a wide process margin and a high throughput, thereby enabling it to be easily applied in mass production lines.

In addition, according to the exemplary embodiment, an exposed region having a relatively large area is also easily applicable. For example, even though a region of nearly 8 inches can be processed in a short time.

It should be noted that the invention is not limited to the above-mentioned exemplary embodiment, and various modifications and changes can be made without departing from the spirit and scope of the invention.

For example, in the above-mentioned embodiment, the work piece is the metal thin film. Other substrates (e.g., quartz or silicon), etc., can be served as the work piece. In this case, a photosensitive film may be formed above the substrate, then an exposure, a development, and an etching may be performed. Further, a film or a substrate having photosensitivity may be served as the work piece.

Figure 20A:
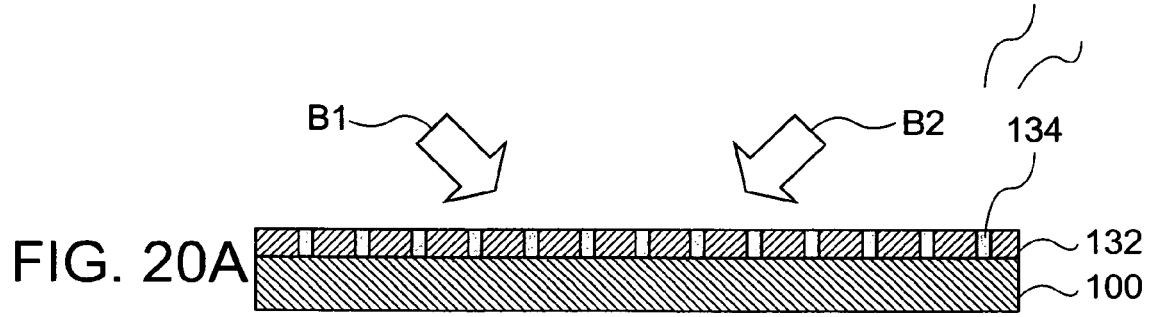
FIGS. 20A-20C are process sectional views illustrating a case in which a film having photosensitivity serves as a work piece.
Figure 20B:
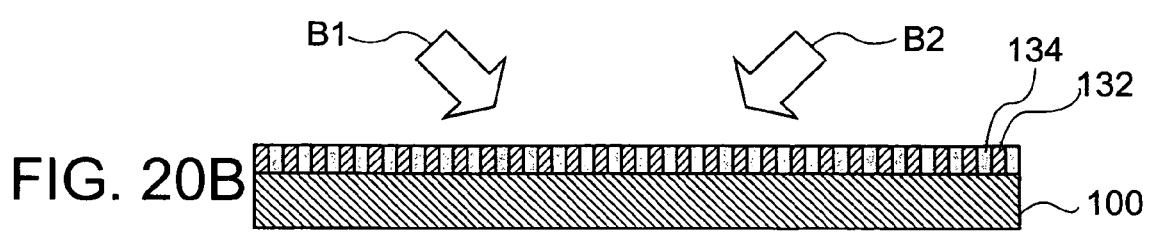
Figure 20C:
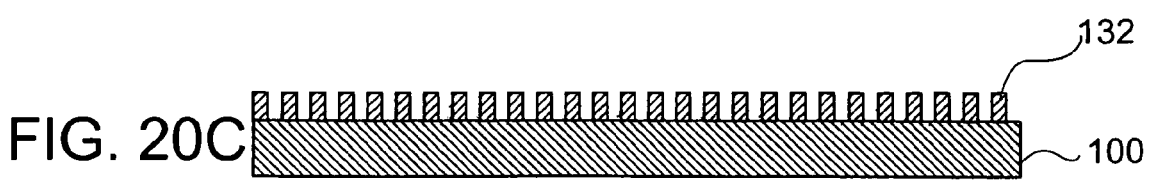

FIGS. 20A-20C are process sectional views illustrating a case in which a film having photosensitivity is served as the work piece. Only relevant processes are partially illustrated. Here, it is preferable that a film made of polyimide resin, etc., is employed as a photosensitive film 132. Likewise the above-mentioned embodiment, the photosensitive film 132 serving as the work piece provided on the substrate 100 is exposed by irradiating the interference light obtained by intersecting two laser beams, (FIG. 20A and FIG. 20B). As a result, a latent image pattern 134 is formed. Then, the exposed part is developed so as to develop a concavo-convex shape corresponding to a pattern of the interference light. As a result, as shown in FIG. 20C, a fine concavo-convex pattern is formed to the photosensitive film 132. Such concavo-convex pattern can be used as, for example, an antireflection structure, such as so-called moth eye, etc.

Figure 21A:
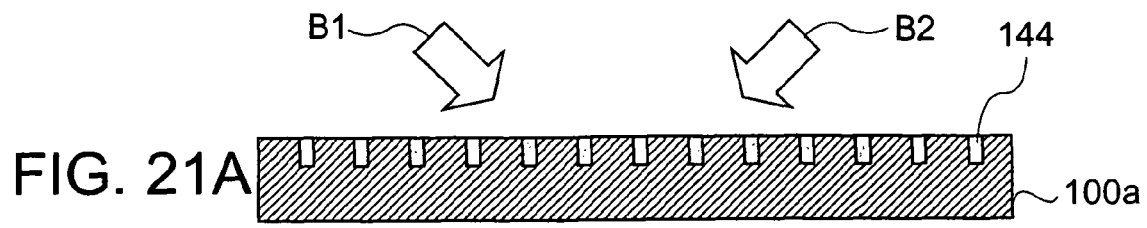
Figure 21B:
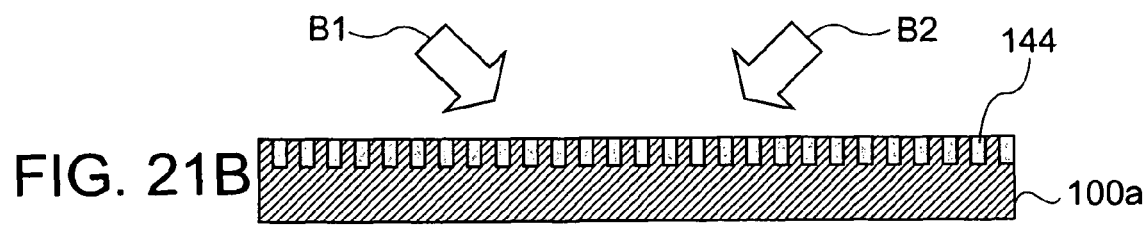
Figure 21C:

FIGS. 21A-21C are process sectional views illustrating a case in which a substrate having photosensitivity is served as the work piece. Only relevant processes are partially illustrated. Here, the substrate 100a made of an acrylic resin having photosensitivity, etc., is served as the work piece. Likewise the above-mentioned embodiment, the substrate 100a serving as the work piece is exposed by irradiating the interference light obtained by intersecting two laser beams (FIG. 21A and FIG. 21B). As a result, a latent pattern 144 is formed in juxtaposition of the surface of the substrate 100a. Then, the exposed part is developed so as to develop a concavo-convex shape corresponding to a pattern of the interference light. As a result, as shown in FIG. 21C, a fine concavo-convex pattern is formed to the surface of the substrate 100a. Such concavo-convex pattern can be used as, for example, an antireflection structure, such as so-called moth eye, etc.

In the above-mentioned second embodiment, a beam generation unit is constructed in which two laser beams are generated by combining the laser light source and a branching unit (diffractive beam splitter). However, the beam generation unit is not limited to this. For example, using two laser light sources each of which outputs one laser beam, the beam generation unit according to the embodiment may be constructed by a method in which the laser light sources are synchronously operated, etc.

In the above-mentioned second embodiment, a spherical wave that is generated by the beam expander composed of the lens and the spatial filter is used as an interference exposure. However, disposing a collimating lens after the beam expander allows a plane wave to be used for the interference exposure. In addition, a variety of fine patterns can be achieved by applying a phase modulation to at least one wavefront, using different types of optical element (lenses, phase plates, computer generated holography, etc.).

Figure 22:
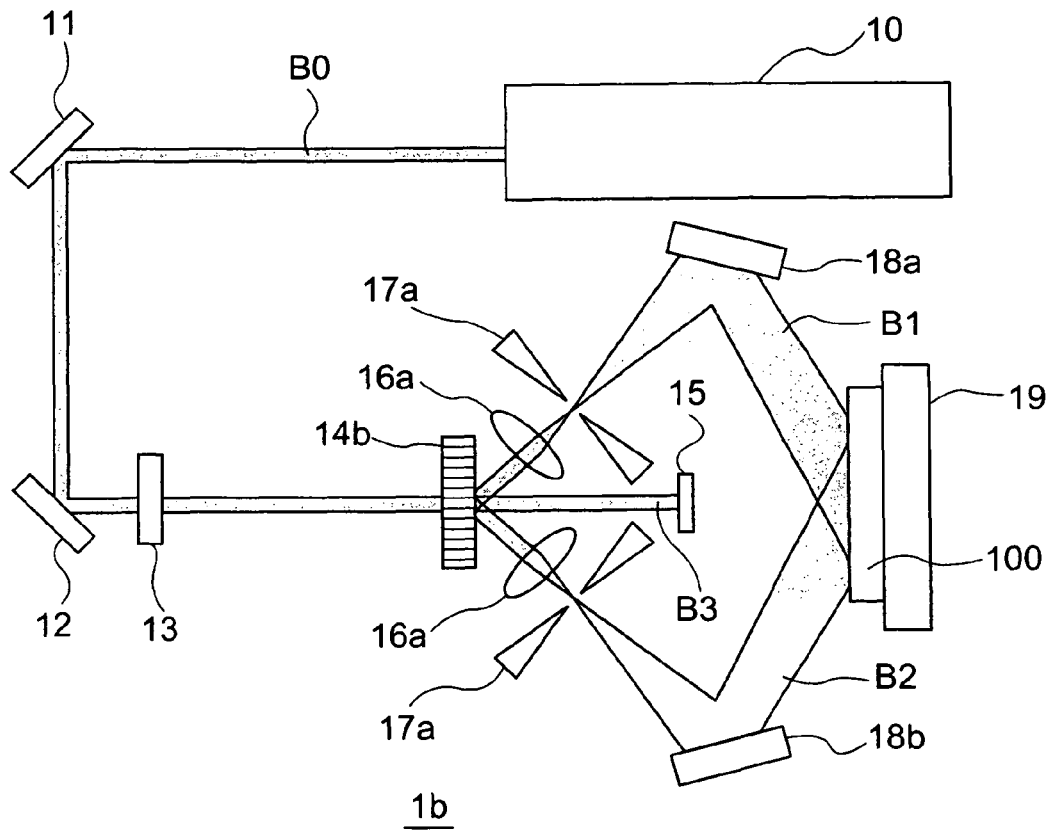
FIG. 22 is an explanatory diagram illustrating a construction of an exposure device according to a third exemplary embodiment of the invention.

FIG. 22 is an explanatory diagram illustrating a construction of an exposure device according to a third exemplary embodiment of the invention. An exposure device 1b shown in FIG. 22 is used for exposing a photosensitive film formed on one surface of the substrate 100. The exposure device 1b includes a laser light source 10, mirrors 11 and 12, a shutter 13, a diffractive beam splitter 14b, a monitor 15, lenses 16a and 16b, spatial filters 17a and 17b, mirrors 18a and 18b, and a stage 19. The exposure device 1b, which basically includes the same construction as that of the exposure device 1 according to the first embodiment, differs in that functions of the diffractive beam splitter 14b is somewhat different from those in the first exemplary embodiment. Below, explanations on contents overlapped with the first embodiment will be omitted.

Figure 23:
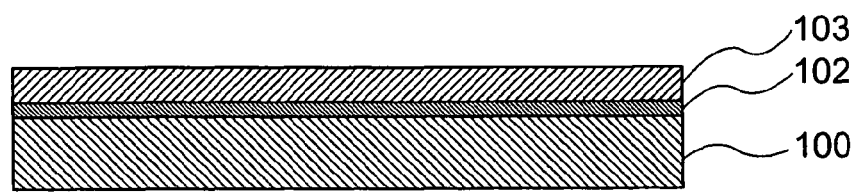
FIG. 23 is a sectional view explaining a photosensitive film, etc., formed on a surface of a substrate.

FIG. 23 is a sectional view explaining a structure of the substrate 100, and a photosensitive film, etc., formed on the surface of the substrate 100. As shown in FIG. 23, in the third exemplary embodiment, the antireflection film 102, and the photosensitive film 103 are formed on one surface of the substrate 100 serving as a work piece.

The substrate 100 serving as the work piece in the third exemplary embodiment, for which, for example, a glass substrate or a resin substrate, etc., is used. That is, in the embodiment, a case is exemplified in which the surface of the substrate 100 is processed into a shape so as to form a microstructure. It should be understood that the work piece is not limited to this, and is arbitrarily selected in accordance with the microstructures to be obtained.

The antireflection film 102 functions to suppress a rear reflection of the interference light upon exposing the photosensitive film 103 by the above-mentioned interference light. For the antireflection film 102, both inorganic materials and organic materials can be employed that can suppress the reflection of the interference light by absorbing the interference light, etc. Particularly, an organic material, such as DUV 44, available from Nissan Chemical Industries, Ltd., etc., makes separations (removals) in later process easier. Accordingly, a good pattern without an interference standing wave can be formed.

The photosensitive film 103 is formed using a material having the following characteristic: a latent image pattern is generated to a part received light irradiation, and either the light irradiated part or a part received no light irradiation can be selectively removed by a predetermined processing in a later process. For example, in the embodiment, the photosensitive film 103 is formed using a chemical amplification resist adjusted to UV wavelengths ($\lambda$: to 250 nm).

Also, in the third embodiment, interference light (interference fringes) is generated by interfering each of the laser beams B1 and B2 whose beam diameter is expanded at a predetermined intersection angle. Then, an exposure is performed by irradiating the interference fringes to the photosensitive film 103 (refer to FIGS. 3-5).

Here, a light intensity distribution I(x) of the interference fringes is given by the following formula.

$$I(x)=I(1)+I(2)+2((I(1)+I(2))^{1/2} \cos (2\pi x/P) \qquad \text{Formula 5}$$

where I(1) is the intensity of the laser beam B1, I(2) is the intensity of the laser beam B2, and x is the position coordinate.

In addition, the contrast C of the interference fringes is defined as follows: (Imax−Imin)/(Imax+Imin). From the formula 2, the contrast C of the interference fringes is given by the following formula.

$$C=2(I(1)\times I(2))^{1/2}/(I(1)+I(2))=2\sqrt{\alpha}/(1+\alpha) \qquad \text{Formula 6}$$

where $\alpha$ represents where $\alpha$ represents the intensity ratio I(1)/I(2) between two laser beams.

Figure 24A:
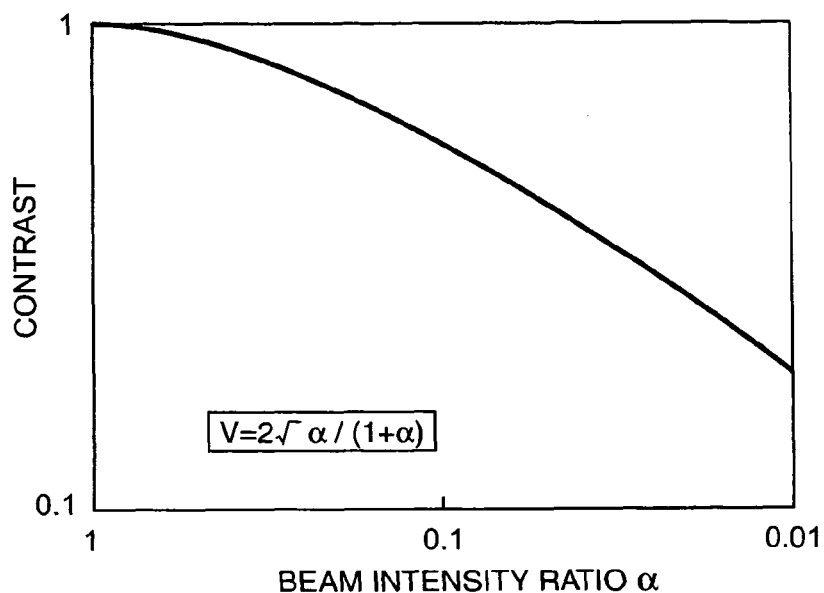
FIGS. 24A and 24B are explanatory diagrams illustrating the relationship of the formula 6.
Figure 24B:
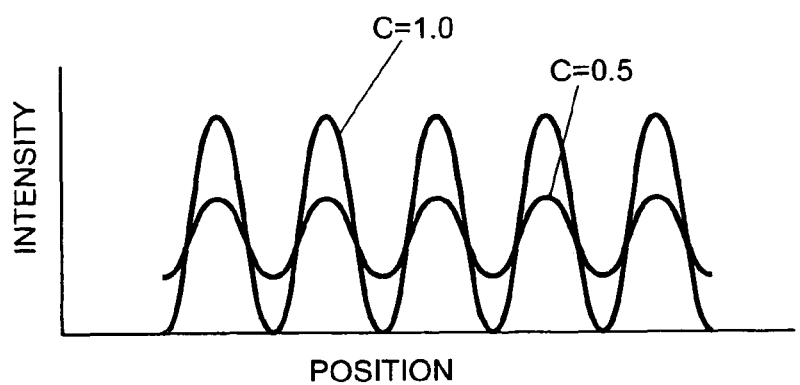

FIGS. 24A and 24B are explanatory diagrams illustrating the relationship of the formula 6. Specifically, FIG. 24A is a graph illustrating the relationship of the formula 6, while FIG. 24B is an explanatory diagram illustrating a light intensity distribution of interference fringes. As shown in FIG. 24A, each beam intensity is the same (the beam intensity ratio I(1)/I(2)=1), the contrast C is 1.0. In this case, as shown in FIG. 24B, the interference fringes are obtained that is sharp with a large difference in contrast. In contrast, as shown in FIG. 24A, if each beam intensity is not the same, the larger difference in beam intensity, the lower contrast. As an example, the light intensity distribution of the interference fringes, where the contrast C is 0.5, is shown in FIG. 24B.

For increasing the contrast of the interference fringes, the displacement of the interference fringes in an exposure should be suppressed as small as possible. In order to achieve this, disturbance (vibrations or air currents) is required to be eliminated. For example, measures are taken in which the exposure system shown in FIG. 22 is placed on a vibration isolation bench, and further the exposure system is covered with a cover, etc., leading to huge effects.

In this way, the exposure can be performed in which the light intensity distribution of the interference light is set to be changeable by adjusting the intensity ratio between two laser beams. In the embodiment, the intensity ratio of two laser beams is adjusted by the diffractive beam splitter 14b. That is, the diffractive beam splitter 14b also functions as a beam intensity ratio control unit. Since plus/minus first-order diffractive beams are used as the laser beam B1 and the laser beam B2, the diffractive beam splitter 14b is designed so that the intensity ratio between the plus first-order diffractive beam and minus first-order diffractive beam is a desired value.

Next, a method for manufacturing the microstructure according to the third embodiment will be described.

FIGS. 25A-25F are process sectional views explaining the method for manufacturing a microstructure according to the third embodiment of the invention.

Figure 25A:
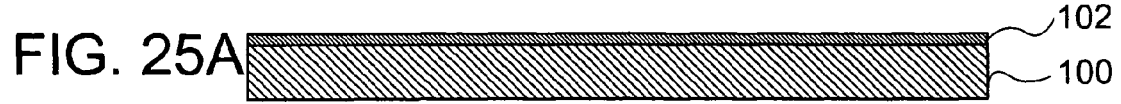
FIGS. 25A-25F are process sectional views explaining a method for manufacturing a microstructure.

First, as shown in FIG. 25A, the antireflection layer 102 is formed on one surface of the substrate 100 serving as the work piece. In this case, a glass substrate having a thickness of 1 mm is used as the substrate 100. The antireflection film 102 is formed to a thickness of approximately 75 nm by a film forming method such as spin coating, etc.

Figure 25B:
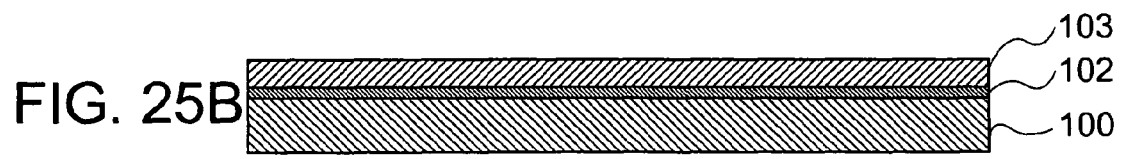

Next, as shown in FIG. 25B, the photosensitive film 103 is formed above the substrate 100 serving as a work piece (in this case, on a surface of the antireflection film 102). In the exemplary embodiment, the photosensitive film 103 having a thickness of approximately 200 nm is formed by a film forming method such as spin coating, etc., using a chemical amplification resist. Here, the chemical amplification resist, which is a mixed liquid composed of a resin, an acid generating agent, and a solvent, utilizes an acid generated by a photochemical reaction. Thus, the resist is sensitively influenced by a small amount of alkali impurities such as ammonia, etc, fluctuating its characteristics. Therefore, in the embodiment, a concentration of alkali impurities is controlled one ppb and below in an atmosphere in which this process, and succeeding processes, i.e., an exposure process and a development process, are performed.

It is preferable that a protective film forming process is added that forms a protective film on a surface of the photosensitive film 103, after forming the photosensitive film. For example, a preferable protective film can be formed by means of spin coating, etc., using TSP-5A, available from Tokyo Ohka Kogyo Co., Ltd. The protective film also can function as antireflection. This allows the photosensitive film 103 made of a photochemical amplification resist to be isolated from air so that influences from surroundings can be suppressed.

Figure 25C:
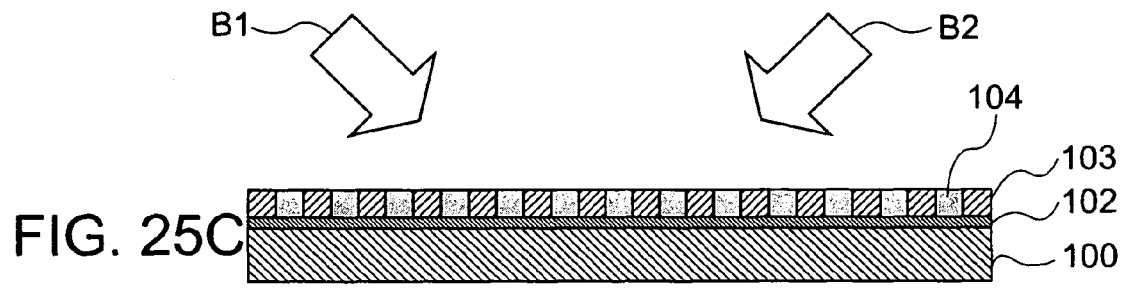

Next, as shown in FIG. 25C, interference light is generated by intersecting the two laser beams B1 and B2 having a wavelength shorter than a wavelength of visible light (in this case, 266 nm) at a predetermined angle. The photosensitive film 103 is exposed by irradiating the interference light. For example, the interference fringes having a period of 150 nm are obtained by the two laser beams B1 and B2 that are intersected at an angle of 62 degrees (refer to FIG. 3). The latent image pattern 104 that corresponds to the interference fringes (interference light) is formed to the photosensitive film 103. In this case, since the laser beams B1 and B2 are used whose beam diameters are expanded to approximately 200 mm by beam expanders, a region of nearly 4 inches can be exposed at one time. The exposure takes around 30 seconds. If a larger region (e.g., nearly 8 inches) is required to be exposed, the substrate 100 may be moved by step and repeat.

Here, the exposure process according to the embodiment will be further minutely described. FIGS. 26A and 26B are diagrams to minutely explain the exposure process, in which plan views of the substrate 100 seen from the upper surface side are shown. FIG. 25 corresponds to the cross-section taken along XXV-XXV line shown in FIG. 26.

As shown in FIG. 26A, the latent image pattern 104 of stripe like (i.e., a one-dimensional pattern) is formed by one time exposure. In a case where the exposure process is completed at this stage, then, a development process and an etching process that will be described later are performed, the latent image pattern 104 of the photosensitive film 103 is transferred so that a fine one-dimensional pattern is formed one surface of the substrate 100.

In addition, a two-dimensional pattern can be formed by exposing several times in which a relative arrangement between the interference light and the photosensitive film 103 is changed to be set. For, example, as shown in FIG. 26B, the photosensitive film 103 is obtained in which unexposed regions (parts with an open square in FIG. 26B) are formed in a matrix like by performing the second exposure in which the relative position between the interference light and the photosensitive film 103 is rotated at 90 degrees with respect to the first exposure. In a case where the development process and the etching process that will be described later are subsequently performed, the latent image pattern 104 of the photosensitive film 103 is transferred so that a fine two-dimensional pattern is formed on one surface of the substrate 100. The changing method of the relative arrangement between the interference light and the photosensitive film at each of two exposures is not limited to the case of 90 degrees rotation shown in FIG. 16B, can be arbitrarily set.

In addition, it is preferable that the intensity ratio between the two beams B1 and B2 is set as a different value in each of a plurality of exposures. In this case, for example, a plurality of diffractive beam splitters are prepared each of which is designed corresponding to a desired intensity ratio. Every exposure, the diffractive beam splitter is replaced. Accordingly, a variety of latent image patterns can be realized in which shapes and aspect ratios are different from each other by setting the contrast of the interference light to be changeable in each exposure. As a result, the number of variations of microstructures obtained by transferring the pattern can be increased. The exposure may be performed in several times in which only the intensity ratio of the beams is changed without changing the relative position between the interference light and the photosensitive film. Even though in this case, a variety of latent image patterns can be achieved by radiating some interference light each of which having a different contrast from each other so as to be overlapped.

Figure 25D:
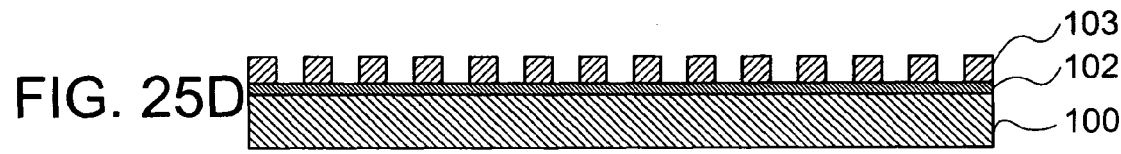
Figure 26A:
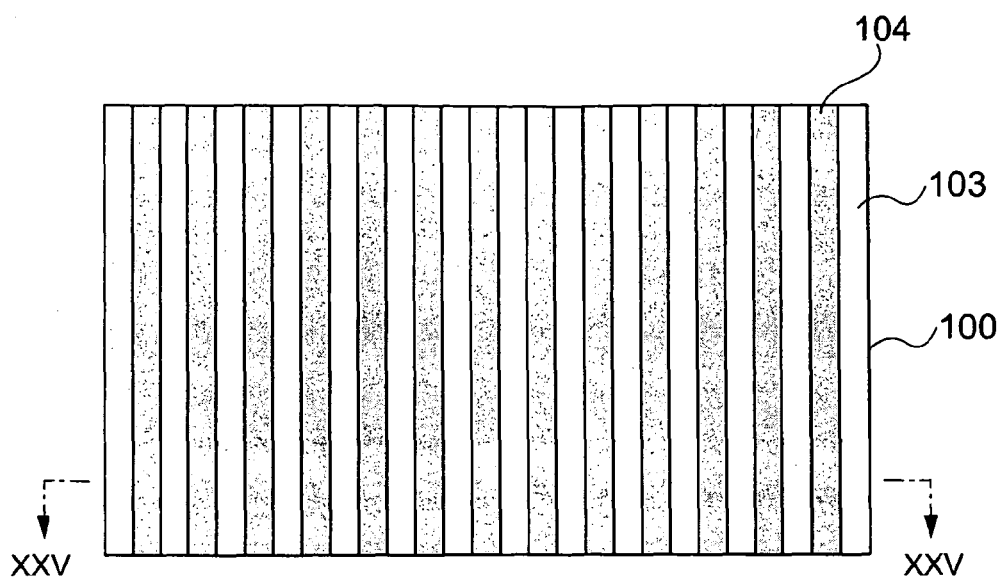
FIGS. 26A and 26B are explanatory views minutely explaining a exposure process.
Figure 26B:
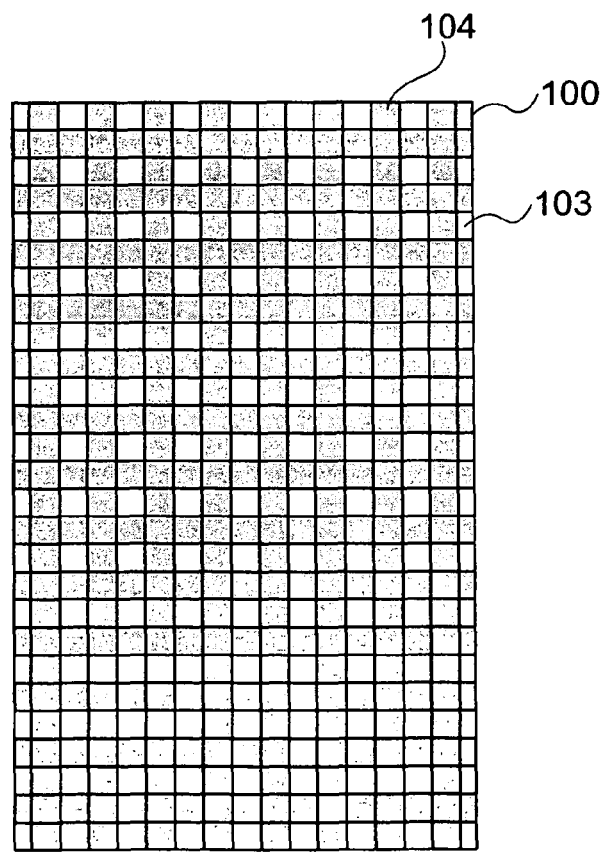

Next, as shown in FIG. 25D, the photosensitive film 103 after the exposure is baked (baking). Subsequently, by performing a development, a shape corresponding to the pattern of the interference light is developed to the photosensitive film 103. As a result, a resist pattern is obtained that has a resolution of approximately 150 nm.

Figure 25E:
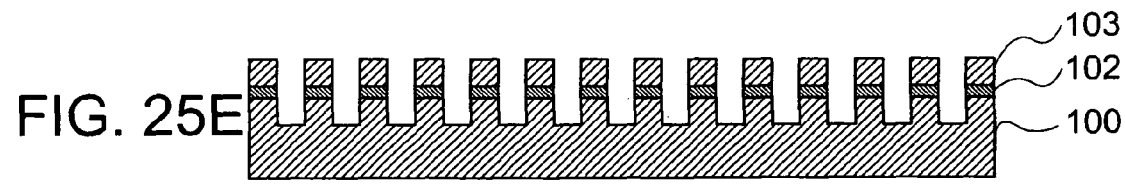

Next, as shown in FIG. 25E, the substrate 100 serving as the work piece is processed by etching using the photosensitive film 103 after the development as an etching mask. Accordingly, the resist pattern is transferred to the substrate 100. For the etching methods, in principle, both wet etching and dry etching can be employed. In particular, it is preferred that the dry etching is performed by means of inductively coupled plasma (ICP) or electron cyclotron resonance (ECR), etc. Removing the antireflection film 102 before etching allows repeatability or uniformity of etching to be further improved.

Figure 25F:

Next, as shown in FIG. 25F, the antireflection film 102 and the photosensitive film 103 are removed. As a result, the substrate 100 is obtained on the surface of which a fine concavo-convex shape is provided.

Figure 27A:
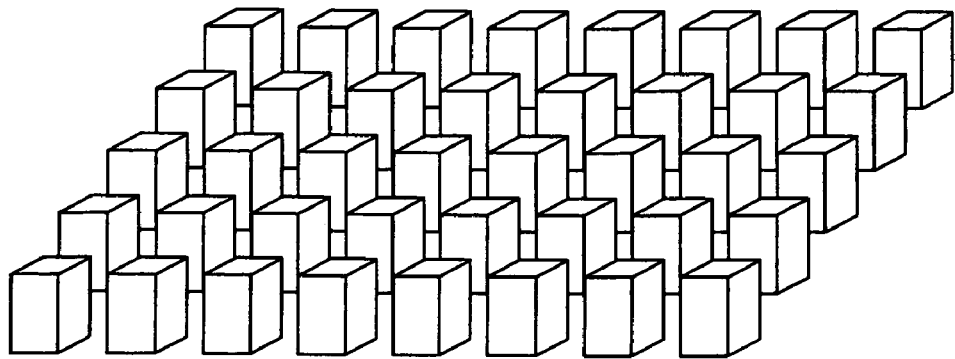
FIGS. 27A and 27B are rough perspective views illustrating microstructures (antireflection elements)
Figure 27B:
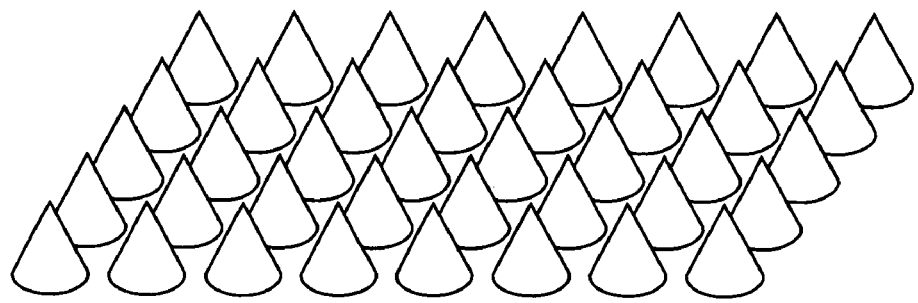

FIG. 27 is a rough perspective view illustrating a microstructure manufactured by a method for manufacturing according to the embodiment. FIG. 27A illustrates an example of microstructure that is obtained by two times exposures with the interference light having a high contrast (e.g., C=1.0). In this case, as shown in FIG. 27A, a microstructure is obtained in which fine prismatic shaped projections are arranged on one surface of the substrate 100 in an array like. FIG. 27B is an example of a microstructure that is obtained by two times exposures with the light having a low contrast (e.g., C=0.5). In this case, as shown in FIG. 27B, a microstructure is obtained in which fine pyramid like projections are arranged on one surface of the substrate 100 in an array like. These microstructures function as an antireflection element (so called moth eye).

In a case where an exposure is performed, a microstructure is obtained in which, for example, a plurality of fine grooves are formed on one surface of the substrate 100. Such microstructure, which has a structural birefringence, for example, functions as a phase plate.

FIGS. 28A and 28B are explanatory diagrams illustrating specific examples of electronic apparatuses. FIG. 28A shows a cellular phone as one application example. A cellular phone 530 includes an antenna part 531, a voice output part 532, a voice input part 533, an operating part 534, and a liquid crystal display device 500 in which the antireflection element according to the embodiment of the invention is built. FIG. 28B shows a video camera as one application example. A video camera 540 includes an image receiving part 541, an operation part 542, a voice input part 543, and a liquid crystal display device 500 in which the antireflection element according to the embodiment of the invention is built. Electronic apparatuses are not limited to these examples, other examples may include fax-machine built-in displays, digital camera finders, mobile TVs, electronic notebooks, etc.

As mentioned above, in the third exemplary embodiment, by intersecting the two laser beams B1 and B2 at a certain degree of angle, the interference light (interference fringes) is obtained that has a contrasting (light intensive distribution) having a pitch of the same level or smaller than of the wavelength of the laser beam. Utilizing such interference light for an exposure allows manufacturing equipment to be drastically simplified. Therefore, fine processing in the order of wavelength shorter than a wavelength of visible light can be realized with low costs. Particularly, in the exposure, the light intensity distribution of the interference light is set to be changeable so that the contrast of the interference light (interference fringes) is set to be changeable, whereby a variety of latent image patterns can be achieved each of which has a different shape and an aspect ratio each other. Consequently, the number of variations in shape and aspect ratio of the microstructure obtained by transferring the latent image pattern can be widened.

Also, according to the embodiment, the exposure process has a wide process margin and a high throughput, thereby enabling it to be easily applied in mass production lines.

In addition, according to the embodiment, an exposed region having a relatively large area is also easily applicable. For example, even though a region of nearly 8 inches can be processed in a short time.

It should be noted that the invention is not limited to the above-mentioned embodiment, and various modifications and changes can be made without departing from the spirit and scope of the invention.

For example, in the above-mentioned embodiment, the work piece is the glass substrate. Other substrates (e.g., silicon substrate), etc., can also be served as the work piece. The photosensitive film also can be used as the work piece.

FIGS. 29A and 29B are process sectional views illustrating a case in which a film having photosensitivity is served as the work piece. Only relevant processes are partially illustrated. Here, it is preferable that a film made of polyimide resin, etc., is employed as a photosensitive film 152. As shown in FIG. 29A, like wise the above-mentioned embodiment, the photosensitive film 152 serving as the work piece provided on the substrate 100 is exposed by irradiating the interference light obtained by intersecting two laser beams. As a result, a latent image pattern 154 is formed. Then, the exposed part is developed so as to develop a concavo-convex shape corresponding to a pattern of the interference light. As a result, as shown in FIG. 29B, a fine concavo-convex pattern is formed that is made of the photosensitive film 152.

In the exposure device 1b according to the embodiment, while the unit is constructed the optical system in which the diffractive beam splitter is employed both as the branching unit that generates two laser beams and the beam intensity ratio control unit, a various types of optical systems can be employed in addition to the system.

Figure 30A:
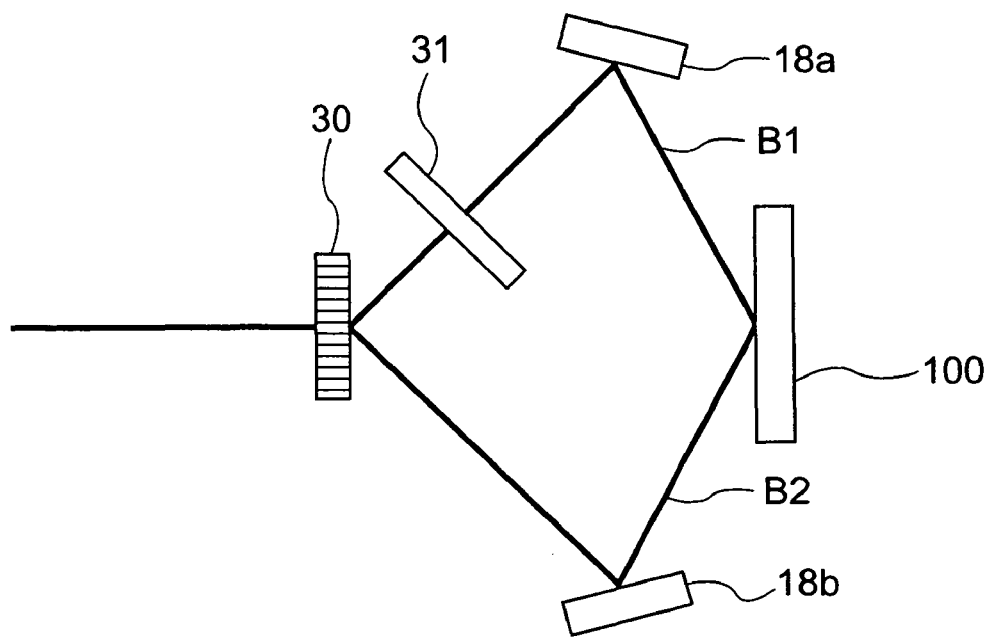
FIGS. 30A and 30B are explanatory diagrams illustrating another construction examples of an optical system.
Figure 30B:
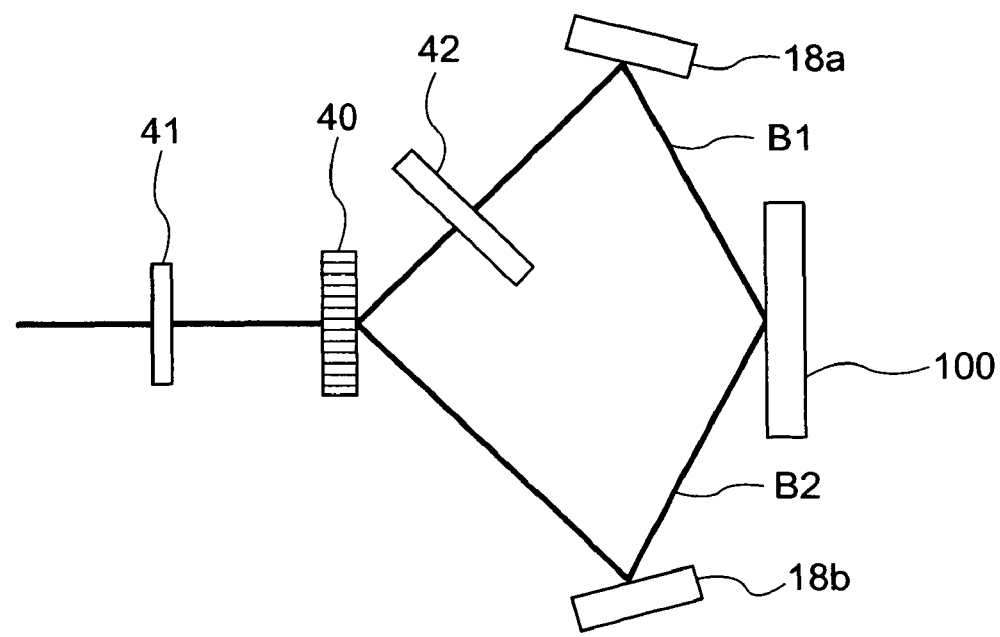

FIGS. 30A and 30B are explanatory diagrams illustrating another construction example of the optical system. Each optical system shown in FIGS. 30A and FIG. 30B should be replaced to a part of the optical system of the exposure device 1b shown in FIG. 22 (the diffractive beam splitter 14b onwards). In FIGS. 30A and FIG. 30B, the construction is simplified in which lenses and spatial filters are omitted, etc., for convenience.

The optical system shown in FIG. 30A is an example in which a half mirror 30 is employed as the branching unit, while an attenuator 31 is employed as the beam intensity ratio control unit. The half mirror 30, which is made of, for example, a transparent substrate such as quartz glass, etc., on which a semi-permeable film such as a metal film is coated, divides the intensity of the incident laser beam B0 to generate two laser beams B1 and B2. The attenuator 31, which is disposed in the optical path of the laser beam B1, attenuates the intensity of the laser beam B1. An attenuator may also be disposed in the optical path of the other laser beam B2. The beam intensity ratio may be adjusted using not only one such like the attenuator that attenuates the laser beam intensity but also an element having a function to amplify the laser beam intensity, etc.

The optical system shown in FIG. 30B is an example in which a polarization light separation element 40 is employed as the branching unit, while a ½ wave plate 41 is employed as the beam intensity control unit. In this case, the intensity ratio between an ordinary ray and an extraordinary ray separated by the polarization light separation element 40 is adjusted by changing the direction of the ½ wave plate 41 that is disposed in front of the polarization light separation element 40. As a result, two laser beams B1 and B2 are obtained whose polarization directions are perpendicular each other. The other ½ wave plate 42 functions to convert the polarization direction of one laser beam B1 obtained by the polarization light separation element 40 to TE polarization from TM polarization.

While in the exemplary embodiment, the beam generation unit is constructed in which two laser beams are generated by combining the laser light source and the branching unit (diffractive beam splitter, etc.), the beam generation unit is not limited this. For example, the beam generation unit according to the embodiment of the invention may be constructed using two laser light sources each of which outputs one laser beam. Further, a diffractive element that is the same as the diffractive elements 50 or 51 described 51 described in the first embodiment can be used as the branching unit and the optical unit. In this case, the intensity ratio between plus first order diffractive beam and minus first order diffractive beam, or the intensity ratio between the transmission beam and the diffracted beam is set so as to be a predetermined value.

Also, in the exemplary embodiment, while the spherical wave generated by the beam expander composed of the lens and the spatial filter is used for the interference exposure, the plane wave can be used by disposing a collimator lens at the back of the beam expander. Further, using a various types of optical element (lenses, phase plates, computer generated holography, etc.), a variety of fine patterns can be achieved by applying a phase modulation to at least one wavefront.

While this invention has been described in conjunction with specific embodiments thereof, it is evident that many alternatives, modifications and variations will be apparent to those skilled in the art. Accordingly, preferred embodiments of the invention as set forth herein are intended to be illustrative, not limiting. There are changes that may be made without departing from the spirit and scope of the invention.

What is claimed is:

1. A method of manufacturing a microstructure, the method comprising:
    generating a first laser beam, a second laser beam, and a third laser beam from a laser light using a branching unit, each of the first laser beam and the second laser beam having a wavelength shorter than a wavelength of visible light, the first laser beam being a plus n order beam, the second laser beam being a minus n order beam, n being a natural number, the third laser beam being a zero order beam and having a lower energy than the first laser beam and the second laser beam;
    reflecting the first laser beam and the second laser beam such that the first laser beam intersects the second laser beam to generate an interference light; and
    setting a relative position between a film and the interference light by referring an output from a monitor, the monitor converting the third laser beam to an electrical signal.

2. The method of manufacturing a microstructure according to claim 1, the setting a relative position between a film and an interference light using the third laser beam including converting the third laser beam into an electrical signal by a monitor, the electrical signal being used to set an intersecting angle of the first laser beam and the second laser beam on the film.

3. The method of manufacturing a microstructure according to claim 2, the electrical signal being used to align a position of the film.

4. The method of manufacturing a microstructure according to claim 2, the monitor being movable.

5. A method of manufacturing a microstructure, comprising:
    forming a first film on a substrate;
    forming a second film on the first film;
    irradiating a first laser beam to a beam splitter, the beam splitter radiating a second laser beam, a third laser beam, and a fourth laser beam, the second laser beam and the third laser beam being n-order diffracted beams, n being a natural number, the fourth laser beam being a zero-order beam;
    exposing the second film by an interference light, the interference light being generated by making the second laser beam intersect the third laser beam, the second laser beam and the third laser beam having a wavelength shorter than a wavelength of visible light;
    developing the second film to a patterned second film; and
    etching the first film using the patterned second film,
    a relative position of the second film and the interference light being set by referring an output from a monitor, the monitor converting the fourth laser beam to an electrical signal.

* * * * *